United States Patent
Kim et al.

(10) Patent No.: US 7,660,168 B2
(45) Date of Patent: *Feb. 9, 2010

(54) READ OPERATION OF MULTI-PORT MEMORY DEVICE

(75) Inventors: Jae-Il Kim, Kyoungki-do (KR); Chang-Ho Do, Kyoungki-do (KR); Jin-Il Chung, Kyoungki-do (KR); Jae-Hyuk Im, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 57 days.

This patent is subject to a terminal disclaimer.

(21) Appl. No.: 11/903,170

(22) Filed: Sep. 20, 2007

(65) Prior Publication Data

US 2008/0074936 A1    Mar. 27, 2008

(30) Foreign Application Priority Data

Sep. 21, 2006    (KR) .................. 10-2006-0091626

(51) Int. Cl.
*G11C 16/04*    (2006.01)
(52) U.S. Cl. ........................ 365/189.05; 365/189.15; 365/189.16; 365/233.1
(58) Field of Classification Search .................. 365/189.15–189.17, 233.1, 230.05, 230.03, 365/233.11–233.12

See application file for complete search history.

(56) References Cited

U.S. PATENT DOCUMENTS

| 5,375,089 | A | 12/1994 | Lo | |
|---|---|---|---|---|
| 6,714,477 | B2 * | 3/2004 | Nakayama et al. | 365/230.03 |
| 7,123,538 | B2 * | 10/2006 | Yamauchi et al. | 365/230.03 |

FOREIGN PATENT DOCUMENTS

| CN | 1755606 A | 4/2006 |
|---|---|---|
| JP | 2000-339999 | 12/2000 |
| JP | 2002-109884 | 4/2002 |
| KR | 1019970075449 | 2/2001 |
| KR | 10-2006-0032948 | 4/2006 |

* cited by examiner

*Primary Examiner*—David Lam
(74) *Attorney, Agent, or Firm*—Blakely, Sokoloff, Taylor & Zafman

(57) ABSTRACT

A multi-port memory device includes a plurality of ports, a plurality of bank control units, a plurality of banks, a read clock generation unit, and a data transmission unit. Each of the banks is connected to a corresponding one of the bank control units. The read clock generation unit generates a read clock toggling for four clocks in response to a read command. The data transmission unit transmits a read data from the banks to a corresponding one of the ports in response to the read clock. Every bank control unit is connected to all of the ports.

61 Claims, 19 Drawing Sheets

FIG. 3D
(PRIOR ART)

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | ACT | WT | PCG | RD | ESC | ABNK | RFU | BANK | | | | COLUMN ADDRESS | | | | | |
| 1 | 0 | '1' | '0' | '0' | PCG | '1' | '0' | ABNK | '0' | 3 | 2 | 1 | 0 | 5 | 4 | 3 | 2 | 1 | 0 |

FIG. 3E
(PRIOR ART)

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | ID | | UPPER BYTE | | | | | | | | LOWER BYTE | | | | | | | |
| 1 | 0 | '1' | '0' | 7 | 6 | 5 | 4 | 3 | 2 | 1 | 0 | 7 | 6 | 5 | 4 | 3 | 2 | 1 | 0 |

FIG. 3F
(PRIOR ART)

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | ACT | COMMAND INFOMATION | | | | | | | | | | | | | | | |
| 1 | 0 | '1' | ACT | 15 | 14 | 13 | 12 | 11 | 10 | 9 | 8 | 7 | 6 | 5 | 4 | 3 | 2 | 1 | 0 |

READ OPERATION OF MULTI-PORT MEMORY DEVICE

CROSS-REFERENCE TO RELATED APPLICATION

The present invention claims priority of Korean patent application number 10-2006-0091626, filed on Sep. 21, 2006, which is incorporated by reference in its entirety.

BACKGROUND OF THE INVENTION

The present invention relates to a semiconductor memory device, and more particularly to a read circuit for use in a multi-port memory device. The multi-port memory device including a plurality of ports employs a serial input/output (I/O) interface for processing a multiple concurrent operation with external devices.

Generally, most memory devices including random access memory (RAM) have a single port with a plurality of input/output pin sets. That is, the single port is provided for data exchange between a memory device and an external chipset. Such a memory device having the single port uses a parallel input/output (I/O) interface to simultaneously transmit multi-bit data through signal lines connected to a plurality of input/output (I/O) pins. The memory device exchanges data with the external device through a plurality of I/O pins in parallel. The I/O interface is an electrical and mechanical scheme to connect unit devices having different functions through signal lines and transmit transmission/reception data precisely. An I/O interface, described below, must have the same precision. The signal line is a bus to transmit an address signal, a data signal, and a control signal. A signal line, described below, will be referred as a bus.

The parallel I/O interface has high data processing efficiency (speed) because it can simultaneously transmit multi-bit data through a plurality of buses. Therefore, the parallel I/O interface is widely used in a short distance transmission that requires a high speed. In the parallel I/O interface, however, the number of buses for transmitting I/O data increases. Consequently, as distance increases, the manufacturing cost increases. Due to the limitation of the single port, a plurality of memory devices is independently configured so as to support various multi-media functions in terms of hardware of a multi-media system.

FIG. 1 is a block diagram of a conventional single port memory device. For convenience of explanation, a conventional ×16 512 M DRAM device as the single port memory device is illustrated.

The ×16 512 M DRAM device includes a plurality of memory cells, first to eighth banks BANK0 to BANK7, a single port PORT, and a plurality of global input/output (I/O) data buses GIO. The plurality of memory cells is arranged with a plurality of N×M memory cells having a matrix form, M and N being positive integers. The first to eighth banks BANK0 to BANK7 includes a row/column decoder for selecting a specific memory cell by row and column lines. The single port PORT controls signals inputted from or outputted to the first to eighth banks BANK0 to BANK7. The global I/O data buses GIO transfers signals between the single port and the banks, and between the single port and input/output (I/O) pins. Referring to FIG. 1, the global I/O data buses GIO include a control bus, fifteen address buses and sixteen data buses.

As described above, the single port memory device includes only a single port with a plurality of I/O pin sets for transferring data signals between the single port memory device and external devices via an external chipset. In the single port memory device, it is difficult to implement various multimedia functions because the single port memory device uses only one port. To implement the various multimedia functions in the single port memory device, each DRAM device has to be constituted independent of each other so as to perform its unique function. When the DRAM devices are constituted independent of each other, it is difficult to allocate a proper memory amount between memory devices based on the number of access times. As a result, an efficient utilization of the whole memory device is decreased.

FIG. 2 is a block diagram of a multi-port memory device disclosed in commonly owned co-pending application, U.S. patent application Ser. No. 11/528,970, filed in the USPTO on Sep. 27, 2006, entitled "MULTI-PORT MEMORY DEVICE WITH SERIAL INPUT/OUTPUT INTERFACE", which is incorporated herein by reference.

For convenience of explanation, the multi-port memory device having four ports and eight banks is illustrated. Particularly, it is assumed that the multi-port memory device has a 16-bit data frame and performs a 64-bit prefetch operation.

As shown, the multi-port memory device includes first to fourth ports PORT0 to PORT3, first to eighth banks BANK0 to BANK7, first and second global input/output (I/O) data buses GIO_OUT and GIO_IN, and first to eighth bank control units BC0 to BC7. Each of the ports PORT0 to PORT3 located at a center of the multi-port memory device is arranged in a row direction, and performs a serial data communication with its own external device. The first to eighth banks BANK0 to BANK7 are classified into upper banks BANK0 to BANK3 and lower banks BANK4 to BANK7 based on their relative location with the first to fourth ports PORT0 to PORT3. The first global I/O bus GIO_OUT is arranged in the row direction between the upper banks BANK0 to BANK3 and the first to fourth ports PORT0 to PORT3, and transmits output data in parallel. The second global I/O bus GIO_IN is arranged in the row direction between the lower banks BANK4 to BANK7 and the first to fourth ports PORT0 to PORT3, and transmits input data in parallel. The first to eighth bank control units BC0 to BC7 control a signal transmission between the first and second global I/O buses GIO_OUT and GIO_IN and the first to eighth banks BANK0 to BANK7. The multi-port memory device further includes a phase locked loop (PLL) circuit 101 between the second and the third ports PORT1 and PORT2. The PLL circuit 101 is provided for controlling input/output timings of internal commands and data input to the first to fourth ports PORT0 to PORT3.

As described above, the multi-port memory device includes a plurality of ports, i.e., PORT0 to PORT3. Each port included in the multi-port memory device operates independently. Therefore, the multi-port memory device is widely employed for digital devices which process several processes concurrently.

FIGS. 3A to 3F are frame formats of serial signals used for a data transmission of the multi-port memory device shown in FIG. 2. FIG. 3A is a basic frame format; FIG. 3B is a write command frame format; FIG. 3C is a write data frame format; FIG. 3D is a read command frame format; FIG. 3E is a read data frame format; and FIG. 3F is a command frame format.

As an example, the read command frame shown in FIG. 3D is described in detail.

Referring to FIG. 3B, the write command frame is a unit of 20-bit serial signals. 18th and 19th bits PHY among the 20-bit serial signals correspond to a physical link coding bit, a 17th bit CMD means a command start point, a 16th bit ACT means an internal active state, a 15th bit WT corresponds to an internal write command, a 14th bit PCG means an internal inactive state, and a 13th bit RD means an internal read command. For example, during a normal read operation, 17th to 13th bits become "10001". During an auto-precharge read operation, 17th to 13th bits become "10011". A 12th bit ESC is a command expand information. By using the ESC bit, it is possible to perform a precharge operation and an auto refresh operation for all banks in the device. A 11th bit ABNK is an active bank information which is set while the RD bit is set. A 10th bit RFU is set while being ignored by the memory. 9th to 6th bits BANK have a bank information where the read operation is performed. 5th to 0th bits have a column address information.

The serial signals, having the frame format shown in FIGS. 3A to 3F, outputted from the plurality of the ports PORT0 to PORT3 are possible to access to every bank control units BC0 to BC7. Therefore, a clear definition for adjusting a transmission of the serialized signals is required for reliable data transmission of the multi-port memory device.

SUMMARY OF THE INVENTION

Embodiments of the present invention are directed to provide a read circuit for used in a multi-port memory device for a reliable read operation by using a read clock toggling for four clocks In accordance with an aspect of the present invention, there is provided a multi-port memory device including a plurality of ports, a plurality of bank control units, a plurality of banks, a read clock generation unit, and a data transmission unit. Each of the banks is connected to a corresponding one of the bank control units. The read clock generation unit generates a read clock toggling for four clocks in response to a read command. The data transmission unit transmits a read data from the banks to a corresponding one of the ports in response to the read clock. Every bank control unit is connected to all of the ports. The read clock generation unit includes a reception unit, a command decoder, a read data output flag generation unit, and a read data output control unit. The reception unit receives parallel data from the ports and generating first and second serial data frames in response to a port information signal. The command decoder generates an internal command by decoding the first serial data frame. The read data output flag generation unit generates a read data output flag used for outputting the read data through the bank control units. The read data output control unit generates a read data output control signal used for outputting the read data to the ports. The port information signal indicates which port accesses the banks.

BRIEF DESCRIPTION OF THE DRAWINGS

FIGS. 3A to 3F are frame formats of serial signals used for a data transmission of the multi-port memory device shown in FIG. 2.

DESCRIPTION OF SPECIFIC EMBODIMENTS

The present invention provides a read operation scheme of a multi-port memory device including a plurality of ports, a plurality of banks, and a plurality of bank control units. Every bank control unit of the multi-port memory device shares all ports included in the multi-port memory device. A data transmission of the multi-port memory device is performed by using the data frame shown in FIGS. 3A to 3F.

Figure 1:
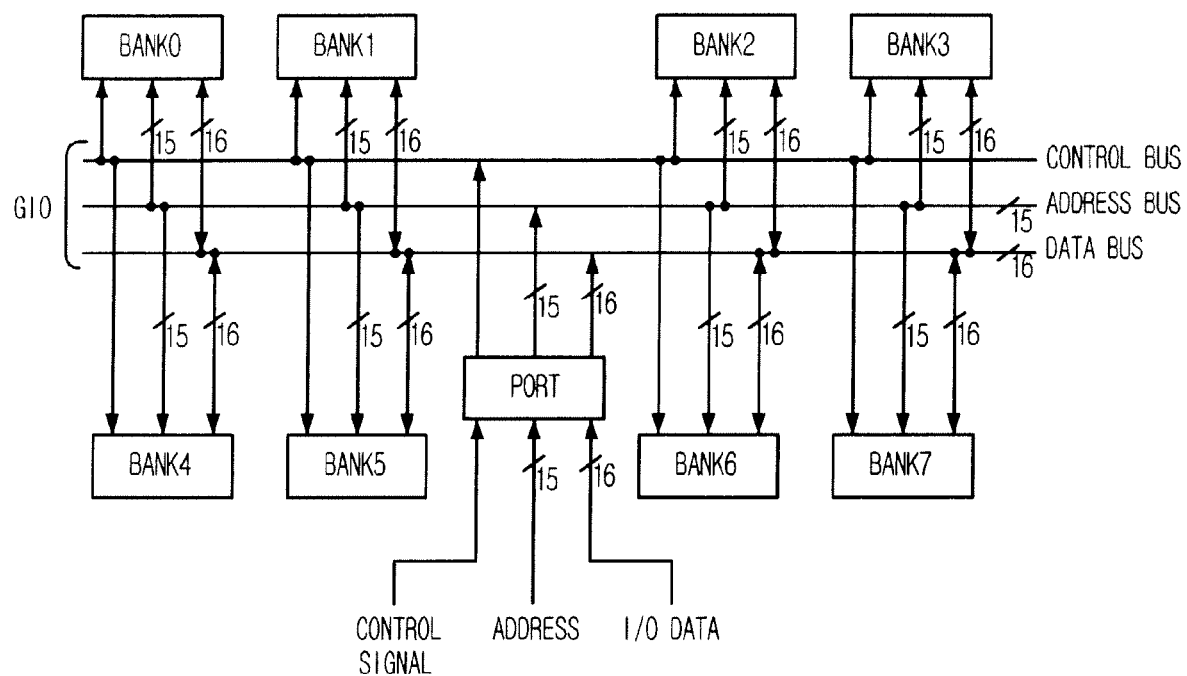
FIG. 1 is a block diagram of a conventional single port memory device.
Figure 2:
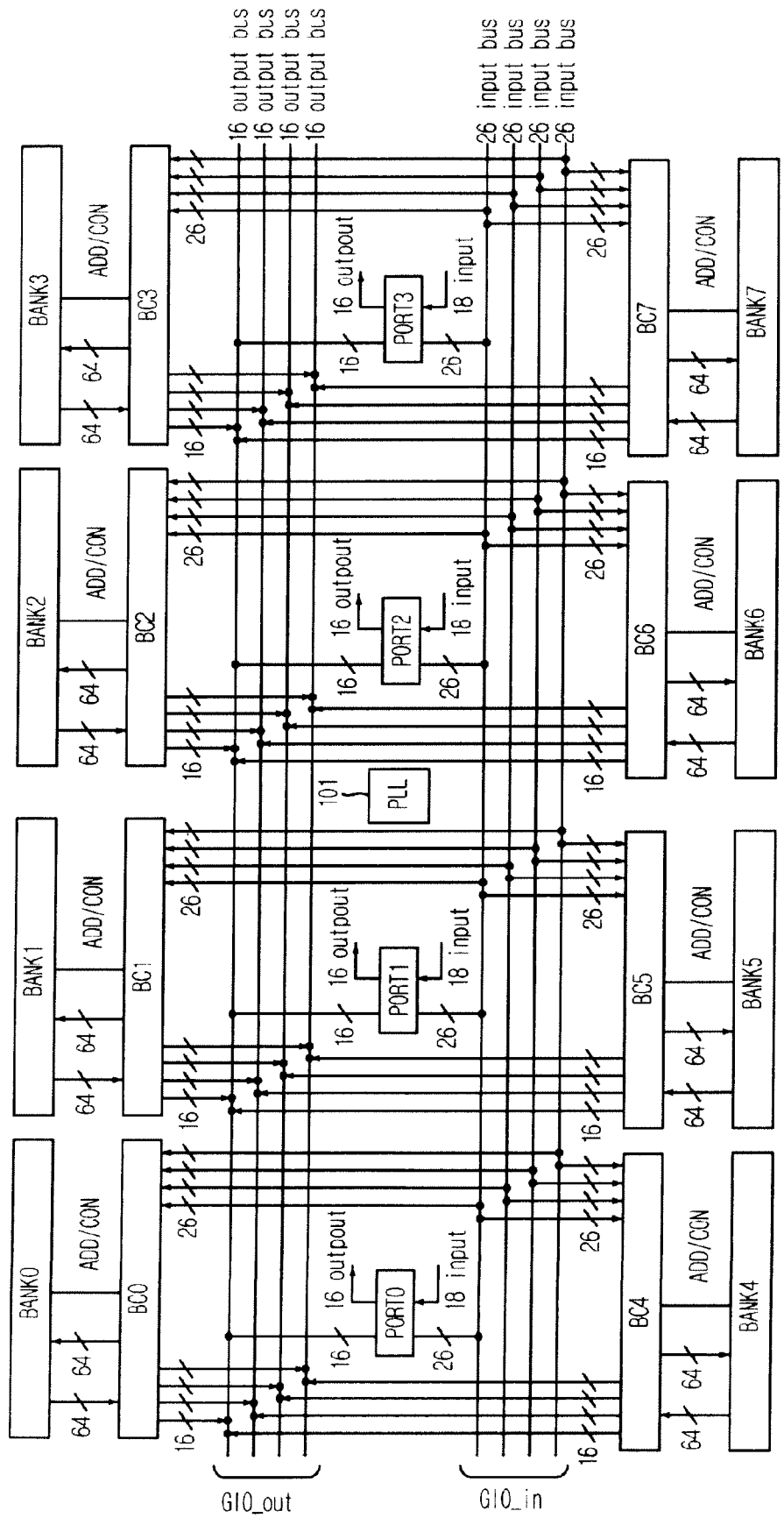
FIG. 2 is a block diagram of a multi-port memory device.
Figure 3A:
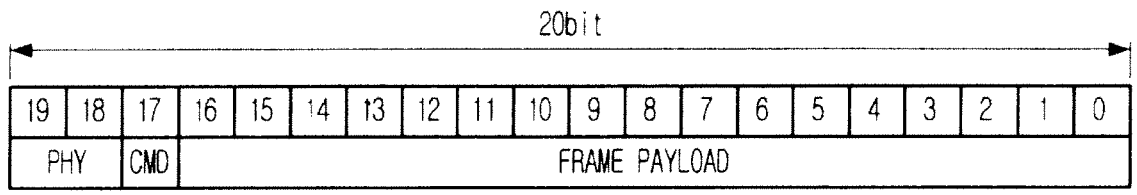
Figure 3B:
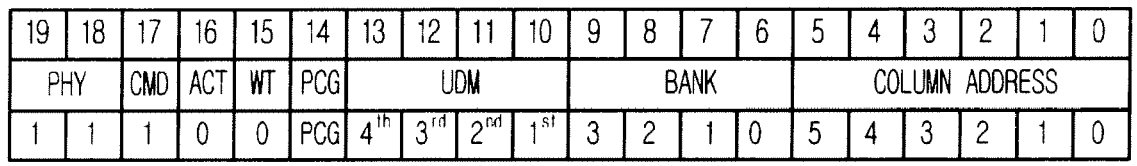
Figure 3C:
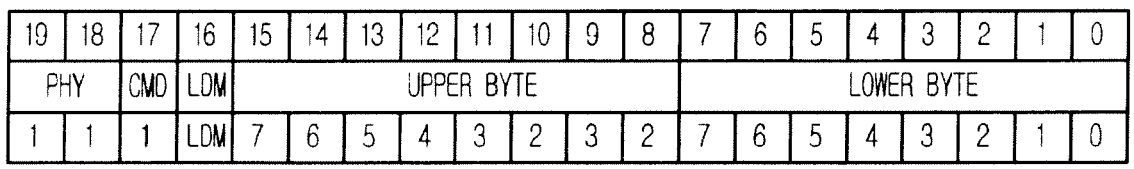
Figure 4:
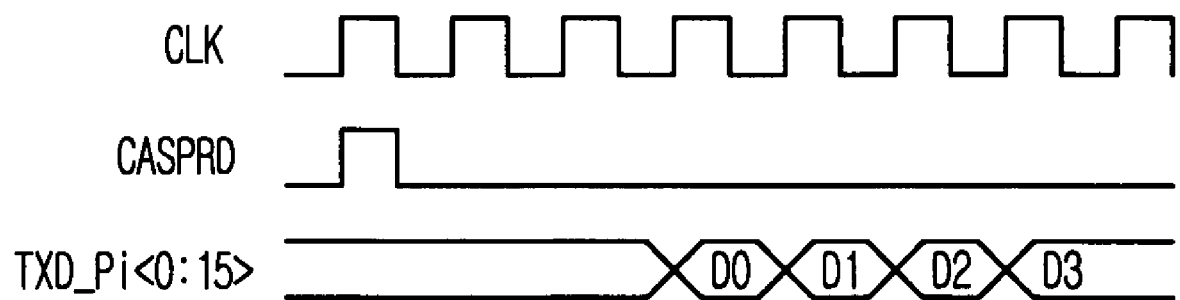
FIG. 4 is a waveform schematically illustrating a read operation scheme of the multi-port memory device in accordance with an embodiment of the present invention.

FIG. 4 is a waveform schematically illustrating a read operation scheme of the multi-port memory device in accordance with an embodiment of the present invention.

After a read command CASPRD is inputted, a port read data TXD_Pi<0:15> is transmitted from banks to ports during four clock periods. It may takes a predetermined clock latency CL from activation of the read command CASPRD to output of the port read data TXD_Pi<0:15>. Herein, 'i' denotes the number of ports included in the multi-port memory device.

Figure 5:
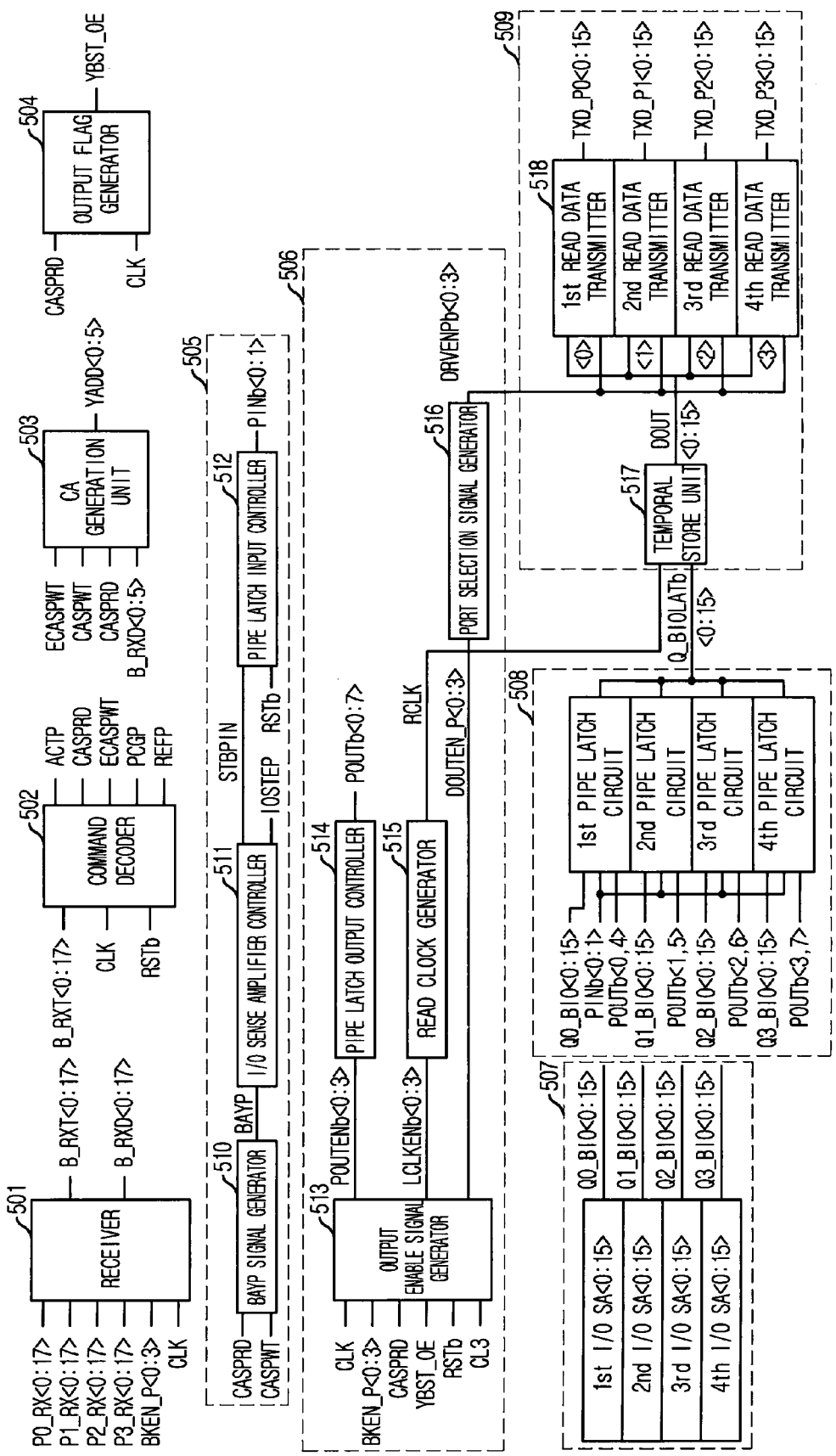
FIG. 5 is a block diagram of a read circuit for performing a read operation of the multi-port memory device in accordance with an embodiment of the present invention.

FIG. 5 is a block diagram of a read circuit for performing a read operation of the multi-port memory device in accordance with an embodiment of the present invention.

The read circuit includes a receiver 501, a command decoder 502, a column address (CA) generation unit 503, an output flag generator 504, a control signal generator 505, a read data output control unit 506, an input/output sense amplification unit 507, a pipe latch unit 508, and a read data output unit 509.

The receiver 501 receives a parallel data P0_RX<0:17>, P1_RX<0:17>, P2_RX<0:17>, and P3_RX<0:17> of 18 bits respectively outputted from the ports PORT0 to PORT3 and generates first and second data frames B_RXT<0:17> and B_RXD<0:17> in response to a port information signal BKEN_P<0:3>. The port information signal BKEN_P<0:3> indicates a port trying to access the banks BANK0 to BANK7. The command decoder 502 decodes the first and the second data frames B_RXT<0:17> and B_RXD<0:17> and outputs a plurality of internal commands ACTP, CASPRD, ECASPWT, PCGP, and REFP. The column address generation unit 503 generates a column address YADD<0:5> based on a column address information stored in the first and the second data frames B_RXT<0:17> and B_RXD<0:17>. The output flag generator 504 generates an output flag YBST_OE in response to the internal read command CASPRD. The control signal generator 505 generates a pipe latch input control signal Pinb<0:1> and an I/O sense amplifier control signal IOSTEP. The read data output control unit 506 controls an output of the read data stored in the pipe latch unit 508 to the ports PORT0 to PORT3. The read data output unit 509 transmits the read data to a corresponding one of the ports PORT0 to PORT3 in response to a control signal generated in the read data output control unit 506.

The control signal generator 505 includes a BYAP signal generator 510, an I/O sense amplifier controller 511, and a pipe latch input controller 512.

The BYAP signal generator 510 generates a BYAP signal based on the internal read command CASPRD and a write operation flag CASPWT. The I/O sense amplifier controller 511 generates the I/O sense amplifier control signal IOSTEP and a pipe latch input control source signal STBPIN based on the BYAP signal. The pipe latch input controller 512 generates the pipe latch input control signal Pinb<0:1> based on the pipe latch input control source signal STBPIN.

The read data output control unit 506 includes an output enable signal generator 513, a pipe latch output controller 514, a read clock generator 515, and a port selection signal generator 516.

The output enable signal generator 513 generates a pipe latch output control source signal POUTENb<0:3>, a read clock source signal RCLKENb<0:3>, and a port selection source signal DOUTEN_P<0:3>. The pipe latch output controller 514 generates a pipe latch output control signal POUTb<0:7> based on the pipe latch output control source signal POUTENb<0:3>. The read clock generator 515 generates a read clock RCLK based on the read clock source signal RCLKENb<0:3>. The port selection signal generator 516 generates a port selection signal DRVENPb<0:3> based on the port selection source signal DOUTEN_P<0:3>.

The read data output unit 509 includes a temporal store unit 517 and a port transmission unit 518. The temporal store unit 517 stores a pipe latch read data Q_BIOLATb<0:15> outputted from the pipe latch unit 508 in response to the read clock RCLK. The port transmission unit 518 transmits a read data DOUT<0:15> outputted from the temporal store unit 517 to the corresponding ports PORT0 to PORT3 in response to the port selection signal DRVENPb<0:3>.

Figure 6A:
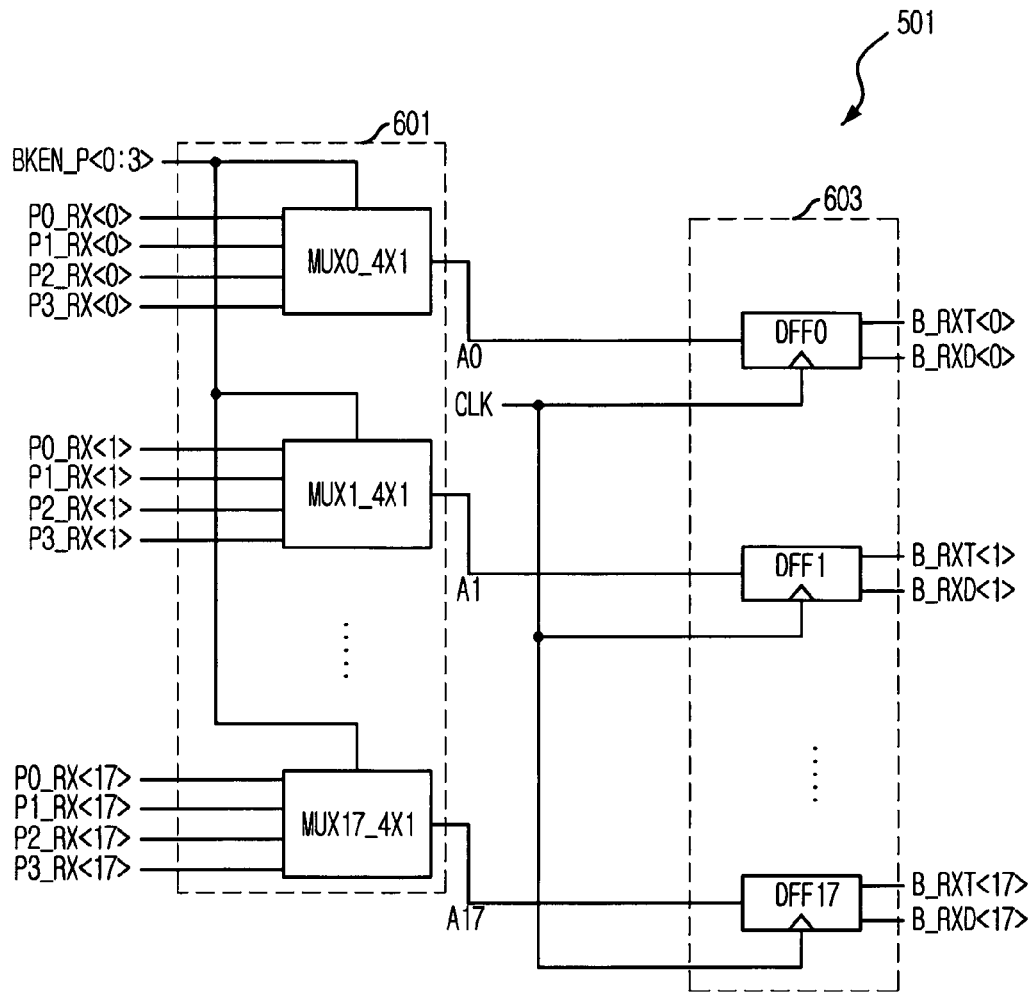
FIG. 6A is a schematic circuit diagram of a receiver shown in FIG. 5.

FIG. 6A is a schematic circuit diagram of the receiver 501 shown in FIG. 5.

The receiver 501 includes a multiplexer (MUX) unit 601 and a flip-flop unit 603. The MUX unit 601 selects one of the parallel data P0_RX<0:17>, P1_RX<0:17>, P2_RX<0:17>, and P3_RX<0:17> in response to a port information signal BKEN_P<0:3> and outputs the selected one to the flip-flop unit 603. The flip-flop unit 603 transmits the selected one in synchronism with a clock signal CLK. The MUX unit 601 includes a plurality of MUXs, e.g., MUX0_4×1, and the flip-flop unit 603 includes a plurality of flip-flops, e.g., DFF0. The number of MUXs and the flip-flops corresponds to the bit numbers of the parallel data, e.g., P0_RX<0:17>. Therefore, in case of the present embodiment, 18 MUXs and flip-flops are included. When first bit BKEN_P<0> of the port enable signal BKEN_P<0:3> has a logic high level, the first parallel data P0_RX<0:17> output from the first port PORT0 is transmitted to the flip-flop unit 603. Each flip-flop in the flip-flop unit 603 transmits each bit of the first parallel data P0_RX<0:17> in synchronism with the clock signal CLK to output the data frames B_RXT<0:17> and B_RXD<0:17>. The first and the second data frames B_RXT<0:17> and B_RXD<0:17> may have the read command frame format and the read data frame format shown in FIGS. 3D and 3E.

Figure 6B:
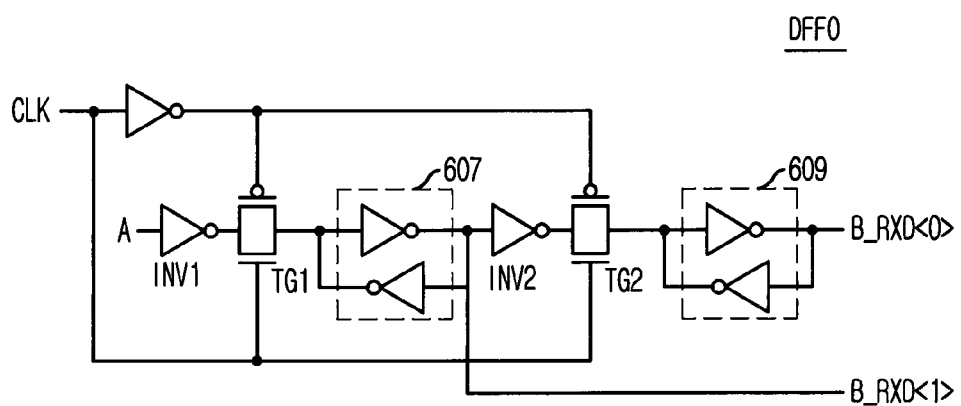
FIG. 6B is a schematic circuit diagram of a first flip-flop included in a flip-flop unit shown in FIG. 6A.

FIG. 6B is a schematic circuit diagram of the first flip-flop DFF0 included in the flip-flop unit 603 shown in FIG. 6A.

The first flip-flip DFF0 includes first and second inverters INV1 and INV2, first and second transmission gates TG1 and TG2, and first and second latches 607 and 609. The first inverter INV1 inverts the output of the first MUX MUX0_4×1 inputted through terminal A. The first transmission gate TG1 transmits an output of the first inverter INV1 in synchronism with the clock signal CLK. The first latch 607 latches an output of the first transmission gate TG1 and output the first bit B_RXT<0> of the first data frame B_RXT<0:17>. The second inverter INV2 inverts the first bit B_RXT<0>. The second transmission gate TG2 transmits an output of the second inverter INV2 in synchronism with the clock signal CLK. The second latch 609 latches an output of the second transmission gate TG2 and outputs the first bit B_RXD<0> of the second data frame B_RXD<0:17>. The first and the second latches 607 and 609 are implemented with even numbers of inverters.

The other flip-flops DFF1 to DFF17 included in the flip-flop unit 603 have similar structures as the first flip-flop DFF0 shown in FIG. 6B.

Figure 7:
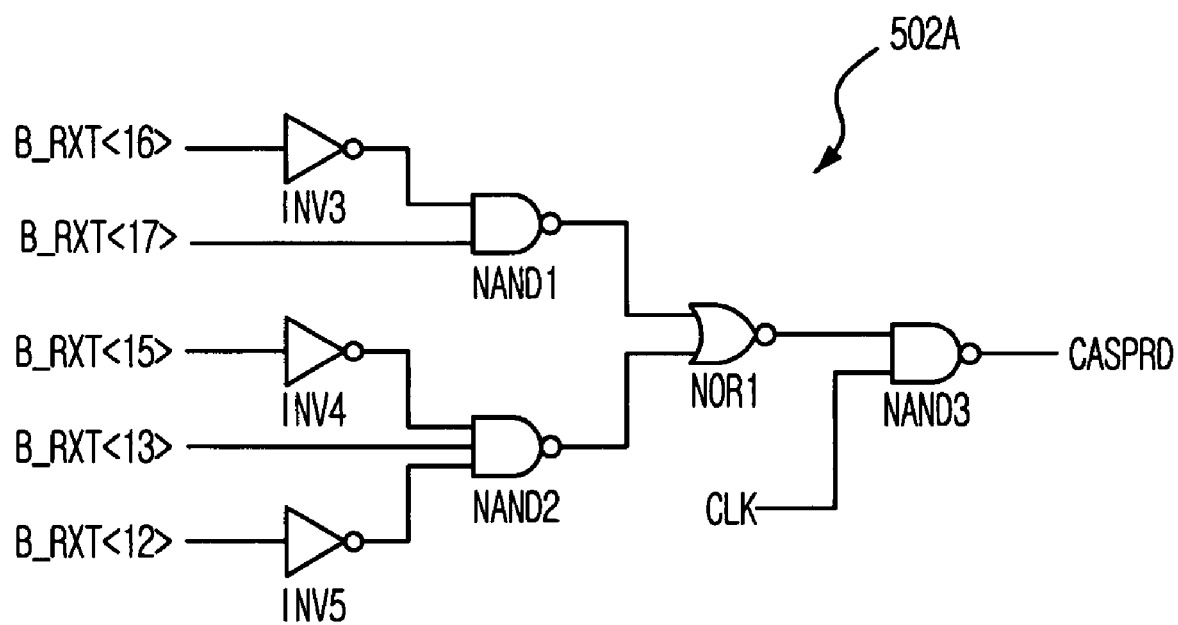
FIG. 7 is a schematic circuit of a read command generator included in a command decoder shown in FIG. 5.

FIG. 7 is a schematic circuit of a read command generator 502A included in the command decoder 502 shown in FIG. 5.

The read command generator 502A generates a read command CASPRD based on a port of the first data frame B_RXT<0:17>. The read command generator 502A generates the read command CASPRD when the first data frame B_RXT<17:15> has '100' and the first data frame B_RXT<13:12> has '10'.

The read command generator 502A includes third to fifth inverters INV3 to INV5, first to third NAND gates NAND1 to NAND3, and a first NOR gate NOR1. The third inverter INV3 inverts the 16th bit B_RXT<16> of the first data frame B_RXT<0:17>. As mentioned above, the first data frame B_RXT<0:17> corresponds to the read command frame format shown in FIG. 3D. Therefore, the 16th bit B_RXT<16> of the first data frame B_RXT<0:17> has the information about the internal active state. The first NAND gate NAND1 logically combines an output of the third inverter INV3 and the 17th bit B_RXT<17> of the first data frame B_RXT<0:17>. The 17th bit B_RXT<17> of the first data frame B_RXT<0:17> has the information about the command start point. The fourth inverter INV4 inverts the 15th B_RXT<15> bit of the first data frame B_RXT<0:17>. The 15th B_RXT<15> bit the first data frame B_RXT<0:17> has the information about the internal write command. The fifth inverter INV5 inverts the 12th bit B_RXT<12> of the first data frame B_RXT<0:17>. The 12th bit B_RXT<12> of the first data frame B_RXT<0:17> has a command expand information. The second NAND gate NAND2 logically combines outputs of the fourth and the fifth inverters INV4 and INV5 and the 13th B_RXT<13> bit the first data frame B_RXT<0:17>. The 13th bit B_RXT<13> bit the first data frame B_RXT<0:17> has the information about the internal read command. The first NOR gate NOR1 logically combines outputs of the first and the second NAND gates NAND1 and NAND2. The third NAND gate NAND3 logically combines an output of the first NOR gate NOR1 and the clock signal CLK to thereby output the read command CASPRD.

Figure 8:
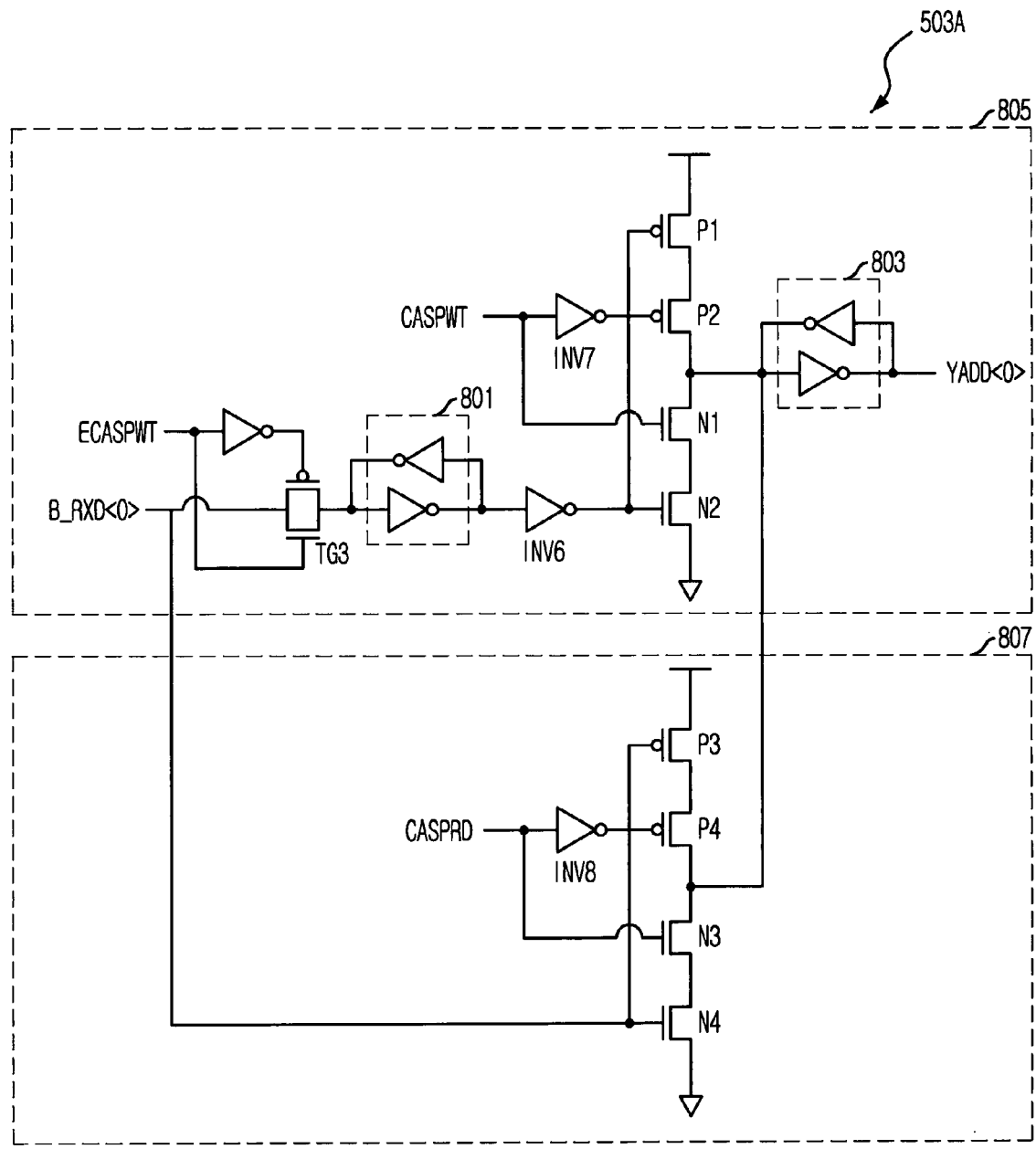
FIG. 8 is a schematic circuit diagram of a column address (CA) generator included in a CA generation unit shown in FIG. 5.

FIG. 8 is a schematic circuit diagram of a CA generator included in the CA generation unit 503 shown in FIG. 5.

The CA generator 503A shown in FIG. 8 generates one bit of the column address YADD<0:5>. Therefore, the CA generation unit 503 shown in FIG. 5 includes six CA generators 503A shown in FIG. 8 for each bit of the second data frame B_RXD<0:5>.

The CA generator 503A includes a write CA generation unit 805 and a read CA generation unit 807. The write CA generation unit 805 generates the column address YADD for a write operation; and the read CA generation unit 807 generates the column address YADD for a read operation.

The write CA generation unit 805 includes a third transmission gate TG3, third and fourth latches 801 and 803, sixth and seventh inverters INV6 and INV7, first and second PMOS transistors P1 and P2, and first and second NMOS transistors N1 and N2. The third transmission gate TG3 transmits one bit, e.g., B_RXD<0>, of the lower byte B_RXD<0:5> of the second data frame B_RXD<0:17> in response to the write command ECASPWT. The write command ECASPWT is generated in the command decoder 502. The third latch 801 latches an output of the third transmission gate TG3. The sixth inverter INV6 inverts the output of the third latch 801. The second NMOS transistor N2 and a first PMOS transistor P1 receive an output of the sixth inverter INV6 through their gates. The first PMOS transistor P1 is connected between the power supply voltage VDD terminal and the second PMOS transistor P2. The second NMOS transistor N2 is connected between the first NMOS transistor N1 and the ground voltage VSS terminal. The seventh inverter INV7 inverts the write operation flag CASPWT. The write operation flag CASWT is activated when both write data and the write command are inputted. The second PMOS transistor P2 and the first NMOS transistor N1 receive an output of the seventh inverter INV7 through their gates. The second PMOS transistor P2 is connected between the first PMOS transistor P1 and a first output terminal. The first NMOS transistor N1 is connected between the first output terminal and the second NMOS transistor N2. The fourth latch 803 latches a signal loaded at the first output terminal and outputs the column address, e.g., YADD<0>.

The read CA generation unit 807 includes an eighth inverter INV8, third and fourth PMOS transistors P3 and P4, and third and fourth NMOS transistors N3 and N4. The eighth inverter INV8 inverts the read command CASPRD. The third PMOS transistor P3 and the fourth NMOS transistor N4 receive one bit, e.g., B_RXD<0>, of the low byte B_RXD<0:5> of the second data frame B_RXD<0:17>. The third PMOS transistor P3 is connected between the power supply voltage VDD terminal and the fourth PMOS transistor P4. The fourth NMOS transistor N4 is connected between the third NMOS transistor N3 and the ground voltage VSS terminal. The fourth PMOS transistor P4 receives an output of the eighth inverter INV8 through its gate. The fourth PMOS transistor P4 is connected between the third PMOS transistor and the first output terminal. The third NMOS transistor N3, connected between the first output terminal and the fourth NMOS transistor N4, receives the write operation flag CASPRD through its gate.

Accordingly, the CA generator 503A having the circuitry shown in FIG. 8 generates the column address, e.g., YADD<0> based on the low byte, e.g., B_RXD<0>, when the read command CASPRD has a logic high level.

Figure 9A:
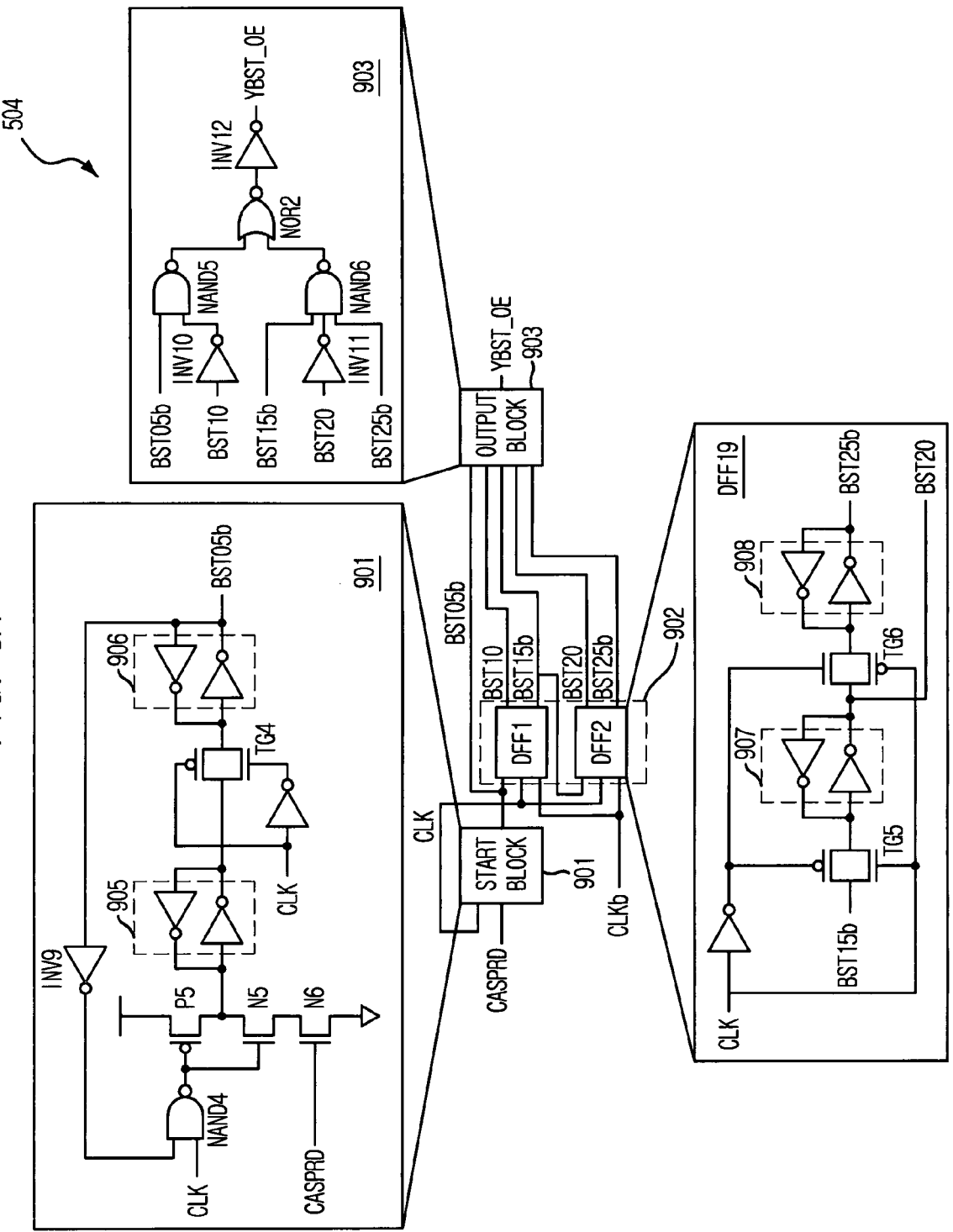
FIG. 9A is a diagram illustrating an output flag generator shown in FIG. 5.

FIG. 9A is a diagram illustrating the output flag generator 504 shown in FIG. 5.

The output flag generator 504 includes a start block 901, a flip-flop block 902, and an output block 903. The start block 901 generates a first control flag BST05b in response to the read command CASPRD. The flip-flop block 902 performs an inverting operation and a shifting operation to the first control flag in response to the clock signal CLK in order to generate a plurality of control flags BST10 to BST25b. The output block 903 logically combines the control flags BST05b to BST25b to output an output flag YBST_OE.

The start block 901 includes a ninth inverter INV9, a fourth NAND gate NAND4, a fifth PMOS transistor P5, fifth and sixth NMOS transistors N5 and N6, fifth and sixth latches 905 and 906, and a fourth transmission gate TG4. The ninth inverter INV9 inverts the first control flag BST05b. The fourth NAND gate NAND9 logically combines an output of the ninth inverter INV9 and the clock signal CLK. The fifth PMOS transistor P5 and the fifth NMOS transistor N5 receive an output of the fourth NAND gate NAND4 through their gates. The fifth PMOS transistor P5 is connected between the power supply voltage VDD terminal and a second output terminal. The fifth NMOS transistor N5 is connected between the second output terminal and the sixth NMOS transistor N6. The sixth NMOS transistor N6, connected between the fifth NMOS transistor N5 and the ground voltage VSS terminal, receives the read command CASPRD through its gate. The fifth latch 905 latches a signal loaded at the second output terminal. The fourth transmission gate TG4 transmits an output of the fourth latch 905 in response to the clock signal CLK. The sixth latch 906 latches an output of the fourth transmission gate TG4 to output the first control flag BST05b.

The flip-flop block 902 includes two flip-flops DFF18 and DFF19. The eighteenth flip-flop DFF18 generates the second and the third control flags BST10 and BST15b based on the first control flag BST05b. The nineteenth flip-flop DFF19 generates the fourth and the fifth control flags BST20 and BST25b based on the third control flag BST15b output from the eighteenth flip-flop DFF18. The eighteenth and the nineteenth flip-flops DFF18 and DFF19 have similar structures.

The nineteenth flip-flop DFF19 includes fifth and sixth transmission gates TG5 and TG6, seventh and eighth latches 907 and 908. The nineteenth flip-flop DFF19 transmits the third control flag BST15b in response to the clock signal CLK. The seventh latch 907 latches an output of the fifth transmission gate TG5 and output the fourth control flag BST20. The sixth transmission gate TG6 transmits the fourth control flag BST20 in response to the clock signal CLK. The eighth latch 908 latches an output of the sixth transmission gate TG6 and outputs the fifth control flag BST25b.

The output block 903 includes three inverters INV10 to INV12, two NAND gates NAND5 and NAND6, and a second NOR gate NOR2. The tenth inverter INV10 inverts the second control flag BST10. The fifth NAND gate NAND5 logically combines the first control flag BST10b and an output of the tenth inverter INV10. The eleventh inverter INV11 inverts the fourth control flag BST20. The sixth NAND gate NAND6 logically combines the third and the fifth control flags BST15b and BST25b and an output of the eleventh inverter INV11. The second NOR gate NOR2 logically combines outputs of the fifth and the sixth NAND gates NAND5 and NAND6. The twelfth inverter INV12 inverts an output of the second NOR gate NOR2 to thereby output the output flag YBST_OE.

Figure 9B:
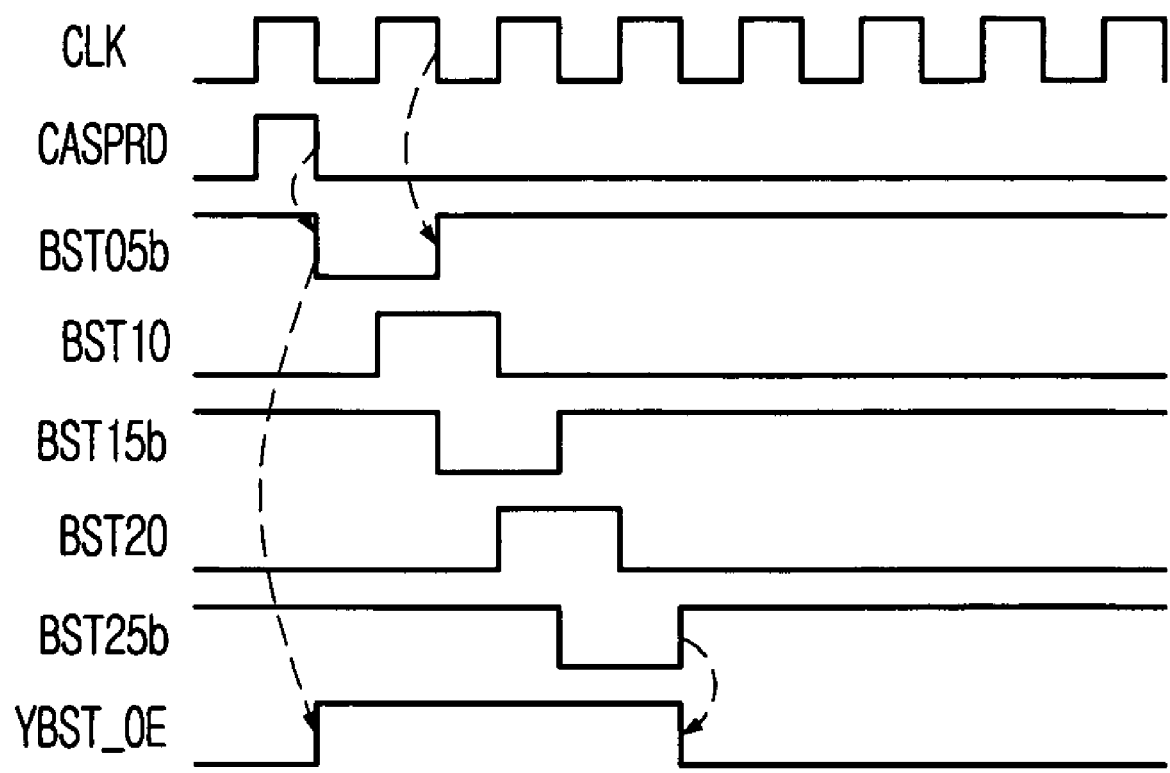
FIG. 9B is a timing diagram describing an operation of the output flag generator shown in FIG. 9B.

FIG. 9B is a timing diagram describing an operation of the output flag generator 504 shown in FIG. 9B.

The start block 901 generates the first control flag BST05b which transitions to a logic low level at a falling edge of the read command CASPRD and transitions to a logic high level at a falling edge of the clock signal CLK. The pulse width of the first control flag BST05*b* has a duration corresponding to one clock period of the clock signal CLK. The flip-flop block 902 generates the second control flag BST10 by inverting and shifting the first control flag BST05*b* for a half period of the clock signal CLK. In the similar way, the flip-flop block 902 further generates the other control flags, i.e., BST15*b* to BST25*b*. The output block 903 logically combines the control flags BST05*b* to BST25*b* and outputs the output flag YBST_OE whose pulse width corresponds to three periods of the clock signal CLK. The output flag YBST_OE is used as a control signal for the read data output control unit 506.

Figure 10:
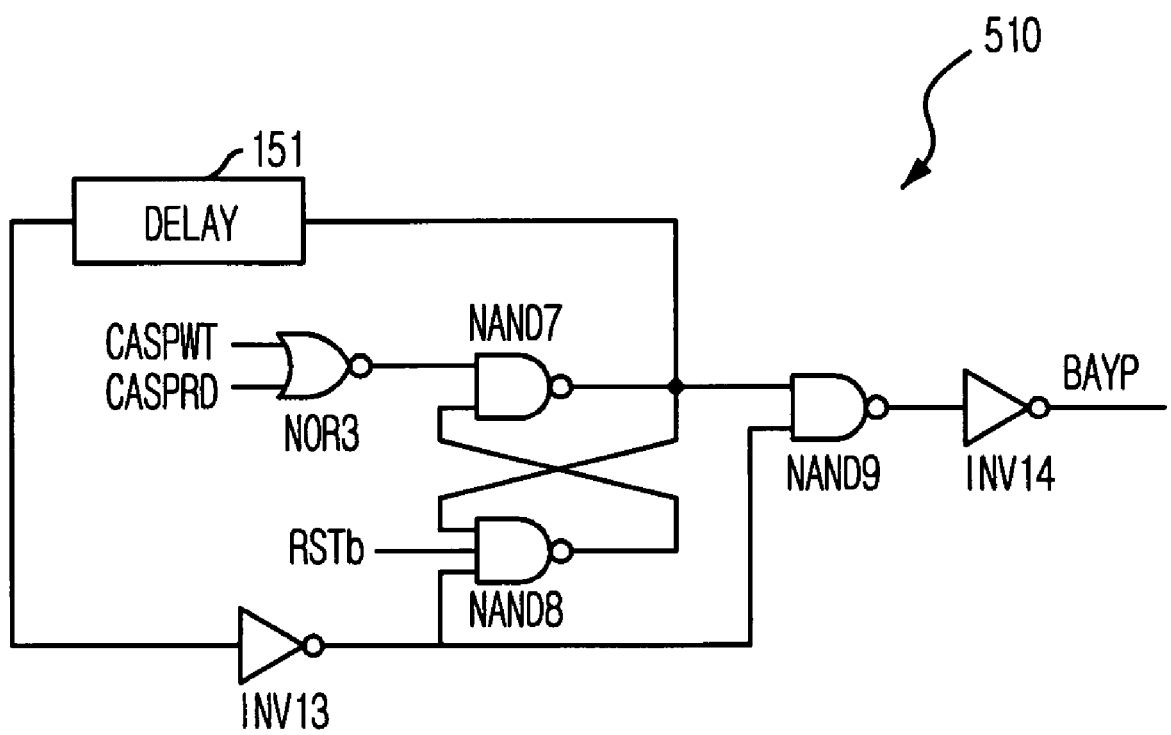
FIG. 10 is a schematic circuit diagram of a source signal generation unit shown in FIG. 5.

FIG. 10 is a schematic circuit diagram of the source signal generation unit 510 shown in FIG. 5.

The source signal generation unit 510 includes a third NOR gate NOR3, three NAND gates NAND7 to NAND9, two inverters INV13 and INV14, and a delay circuit 151. The third NOR gate NOR3 logically combines the read command and the write operation flag CASPWT. The seventh NAND gate NAND7 logically combines outputs of the third NOR gate NOR3 and the eighth NAND gate NAND8. The delay circuit 151 delays an output of the seventh NAND gate NAND7. The thirteenth inverter INV13 inverts an output of the delay circuit 151. The eighth NAND gate NAND8 logically combines outputs of the seventh NAND gate NAND7 and the thirteenth inverter INV13 and a reset signal RSTb. The ninth NAND gate NAND9 logically combines the outputs of the seventh NAND gate NAND7 and the thirteenth inverter INV13. The fourteenth inverter inverts an output of the ninth NAND gate NAND9 to output a source signal BAYP.

Figure 11:
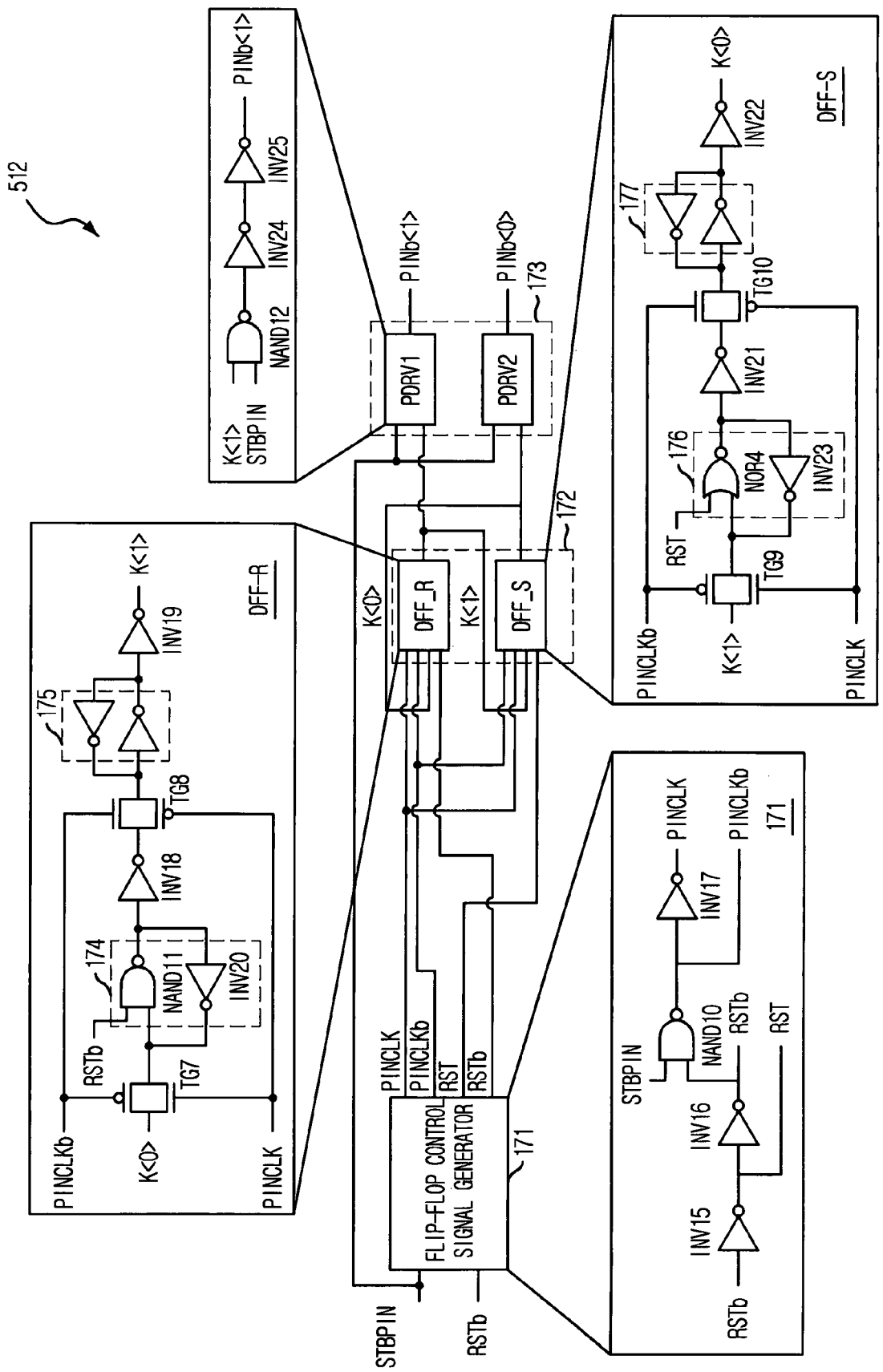
FIG. 11 is a schematic circuit diagram of a pipe latch input controller shown in FIG. 5.

FIG. 11 is a schematic circuit diagram of the pipe latch input controller 512 shown in FIG. 5.

The pipe latch input controller 512 includes a flip-flop control signal generator 171, a control signal transmission unit 172, and a control signal output unit 173. The flip-flop control signal generator 171 generates flip-flop control signals PINCLK and PINCLKb based on the pipe latch source signal STBIN outputted from the I/O sense amplifier controller 511. The control signal transmission unit 172 transmits output signals K<0:1> in response to the flip-flop control signals PINCLK and PINCLKb. The control signal output unit 173 logically combines the output signals K<0:1> and the pipe latch source signal STBIN and generates pipe latch input control signals PINb<0:1>.

The flip-flop control signal generator 171 includes three inverters INV15 to INV17 and a tenth NAND gate NAND10. The 15th inverter INV15 inverts the reset signal RSTb and outputs an inverted reset signal RST. The 16th inverter INV16 inverts the inverted reset signal RST. The tenth NAND gate NAND10 logically combines the reset signal RSTb outputted from the 16th inverter INV16 and the pipe latch source signal STBIN and outputs the second flip-flop control signal PINCLKb. The 17th inverter INV17 inverts the second flip-flop control signal PINCLKb outputted from the tenth NAND gate NAND10 and outputs the first flip-flop control signal PINCLK.

The control signal transmission unit 172 includes two flip-flops DFF_R and DFF_S. The R flip-flop DFF_R includes two transmission gates TG7 and TG8, two latches 174 and 175, and two inverters INV18 and INV19. The seventh transmission gate TG7 transmits the first output signal K<0> outputted from the S flip-flop DFF_S in response to the flip-flop control signals PINCLK and PINCLKb. The ninth latch 174 latches and resets an output of the seventh transmission gate TG7 in response to the reset signal RSTb. The 18th inverter INV18 inverts an output of the ninth latch 174. The eighth transmission gate TG8 transmits an output of the 18th inverter INV18 in response to the flip-flop control signals PINCLK and PINCLKb. The tenth latch 175 latches an output of the eighth transmission gate TG8. The 19th inverter INV19 inverts an output of the tenth latch 175 and outputs the second output signal K<1>. The ninth latch 175 includes an eleventh NAND gate NAND11 and a 20th inverter INV20. The eleventh NAND gate NAND11 logically combines the reset signal RSTb and the output of the seventh transmission gate TG7. The 20th inverter INV20 inverts an output of the 11th NAND gate NAND11.

Further, the S flip-flop DFF_S includes two transmission gates TG9 and TG10, two latches 176 and 177, and two inverters INV21 and INV22. The ninth transmission gate TG9 transmits the second output signal K<1> outputted from the R flip-flop DFF_R in response to the flip-flop control signals PINCLK and PINCLKb. The 11th latch 176 latches and resets an output of the ninth transmission gate TG9 in response to the inverted reset signal RST. The 21th inverter INV21 inverts an output of the 11th latch 176. The tenth transmission gate TG10 transmits an output of the 21th inverter INV21 in response to flip-flop control signals PINCLK and PINCLKb. The 12th latch 177 latches an output of the tenth transmission gate TG10. The 22th inverter INV22 inverts an output of the 12th latch 177 and generates the first output signal K<0>. The 11th latch 176 includes a fourth NOR gate NOR4 and a 23th inverter INV23. The fourth NOR gate NOR4 logically combines the inverted reset signal RST and an output of the ninth transmission gate TG9. The 23th inverter INV23 inverts an output of the fourth NOR gate NOR4.

The control signal output unit 173 includes two output drivers PDRV1 and PDRV2. The first output driver PDRV1 logically combines the second output signal K<1> and the pipe latch source signal STBIN and generates the second pipe latch input control signal PINb<1>. The second output driver PDRV2 logically combines the first output signal K<0> and the pipe latch source signal STBIN and generates the first pipe latch input control signal PINb<0>. The first output driver PDRV1 includes a 12th NAND gate NAND12 and two inverters INV24 and INV25. The 12th NAND gate NAND12 logically combines the second output signal K<1> and the pipe latch source signal STBIN. The 24th inverter INV24 inverts an output of the 12th NAND gate NAND12. The 25th inverter INV25 inverts an output of the 24th inverter INV24 and generates the second pipe latch input control signal PINb<1>. The second output driver PDRV2 has a similar structure as the first output driver PDRV1.

Figure 12:
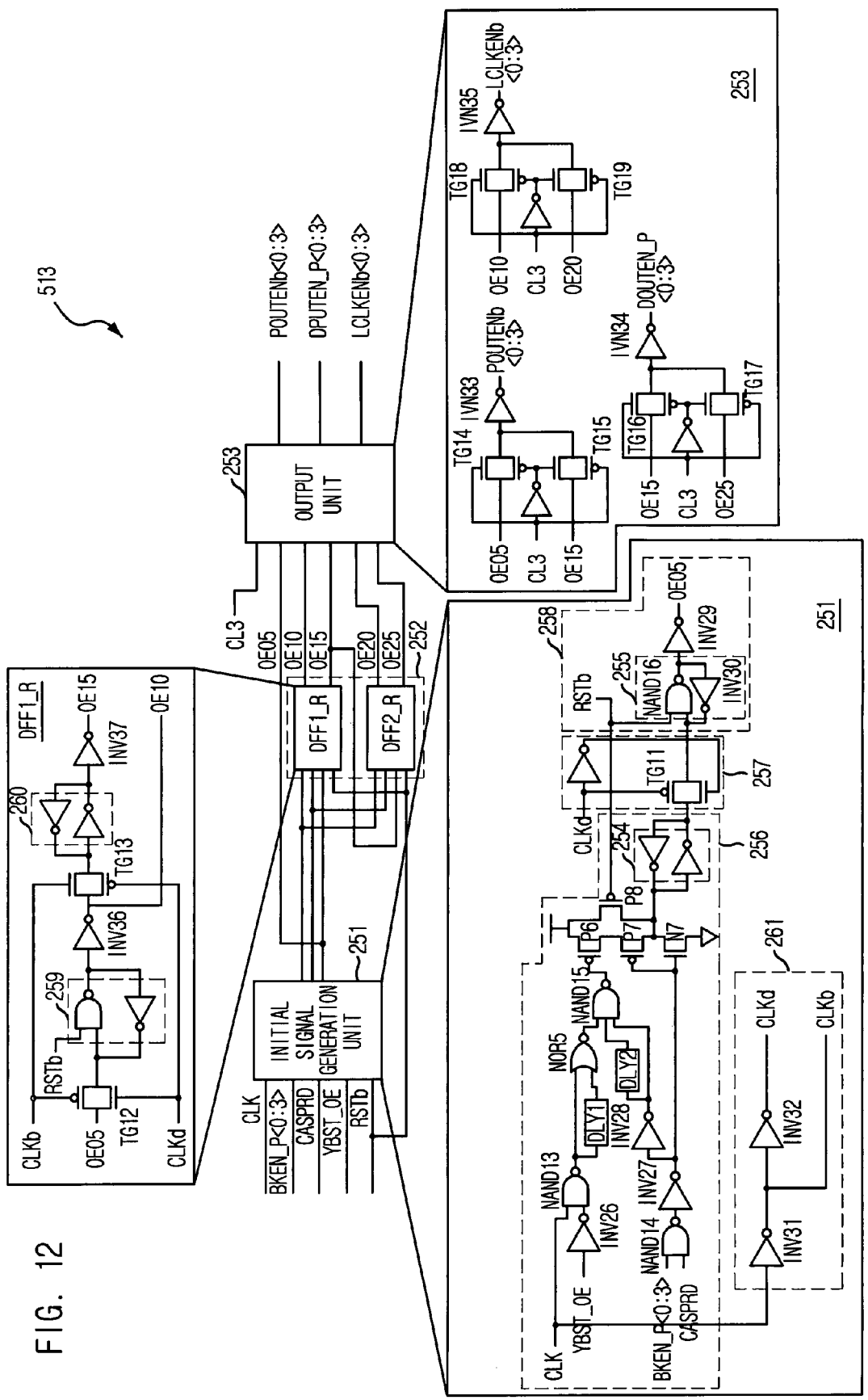
FIG. 12 is a schematic circuit diagram of an output enable signal generator shown in FIG. 5.

FIG. 12 is a schematic circuit diagram of the output enable signal generator 513 shown in FIG. 5.

The output enable signal generator 513 includes an initial signal generation unit 251, an output signal generation unit 252, and an output enable signal output unit 253.

The initial signal generation unit 251 includes an input unit 256, a transmission unit 257, an output unit 258, and a clock division unit 261. The clock division unit 261 includes two inverters INV31 and INV32. The 31th inverter INV31 inverts the clock signal CLK and outputs an inverted clock signal CLKb. The 32th inverter INV32 inverts the inverted clock signal CLKb and generates a delayed clock signal CLKd. The input unit 256 includes four inverters INV26 to INV29, three NAND gates NAND13 to NAND15, two delay circuits DLY1 and DLY2, a fifth NOR gate NOR5, three PMOS transistors P6 to P8, and a seventh NMOS transistor N7. The 26th inverter INV26 inverts the output flag YBST_OE. The 13th NAND gate NAND13 logically combines the clock signal CLK and an output of the 26th inverter INV26. The first delay circuit DLY1 delays an output of the 13th NAND gate NAND13. The fifth NOR gate NOR5 logically combines outputs of the 13th NAND gate NAND13 and the first delay circuit DLY1. The 14th NAND gate NAND14 logically combines the port enable signal BKEN_P<0:3> and the read command CASPRD. The 27th inverter INV27 inverts an output of the 14th NAND gate NAND14. The 28th inverter INV28 inverts an output of the 27th inverter INV27. The second delay circuit DLY2 delays an output of the 28th inverter INV28 for a predetermined time. The 15th NAND gate NAND15 logically combines outputs of the fifth NOR gate NOR5, the second delay circuit DLY2, and the 28th inverter. The sixth PMOS transistor P6 receives an output of the 15th NAND gate NAND15 through its gate. The sixth PMOS transistor P6 is connected between the power supply voltage VDD terminal and the seventh PMOS transistor P7. The seventh PMOS transistor P7 and the seventh NMOS transistor N7 receive the output of the 27th inverter INV27 through their gates. The seventh PMOS transistor P7 is connected between the sixth PMOS transistor P6 and a third output terminal. The seventh NMOS transistor N7 is connected between the seventh PMOS transistor P7 and the ground voltage VSS terminal. The eighth PMOS transistor P8, receiving the reset signal RSTb through its gate, is connected between the power supply voltage VDD terminal and the third output terminal. The 13th latch 254 latches a signal loaded at the third output terminal. The transmission unit 257 includes a 11th transmission gate TG11. The 11th transmission gate TG11 transmits an output of the 13th latch 254 in response to the delayed clock signal CLKd. The output unit 258 includes 14th latch and a 30th inverter. The 14th latch 255 latches and resets an output of the 11th transmission gate TG11 in response to the reset signal RSTb. The 14th latch 255 includes a 16th NAND gate NAND16 and a 30th inverter INV30. The 16th NAND gate NAND16 logically combines the reset signal RSTb and the output of the 11th transmission gate TG11. The 29th inverter INV29 inverts an output of the 14th latch 255 and outputs a first output enable signal OE05.

The output signal generation unit 252 includes two flip-flops DFF1_R and DFF2_R. The flip-flops DFF1_R and DFF2_R have similar structures. The flip-flop DFF1_R includes two transmission gates TG12 and TG13, two latches 259 and 260, and two inverters INV36 and INV37. The 12th transmission gate TG12 transmits the first output enable signal OE05 in response to the delayed clock signal CLKd and the inverted clock signal CLKb. The 15th latch 259 latches and resets an output of the 12th transmission gate TG12. The 36th inverter INV36 inverts an output of the 15th latch 259 and outputs a second output enable signal OE10. The 13th transmission gate TG13 transmits an output of the 36th inverter INV36 in response to the delayed clock signal CLKd and the inverted clock signal CLKb. The 16th latch 260 latches an output of the 13th transmission gate TG13. The 37th inverter INV37 inverts an output of the 16th latch 260 and outputs a third output enable signal OE15. In a similar way, the flip-flop DFF2_R generates fourth and fifth output enable signals OE20 and OE25 based on the third output enable signal OE15. The output signals OE05 to OE25 have a pulse width corresponding four clock periods and are generated by synchronized with the clock signal CLK based on the first output enable signal OE05. The numbers such as 05, 10, 15, 20, 25 of the output enable signals denote a generation timing thereof. For example, the second output enable signal OE10 is generated after one clock period from the rising edge of the clock signal CLK where the read command CASPRD is activated.

The output signal output unit 253 includes a pipe latch control source signal generator 261, a read clock source signal generator 262, and a port selection source signal generator 263. The pipe latch control source signal generator 261 generates a pipe latch control source signal POUTENb<0:3> used for generating the pipe latch output control signal POUTb<0:7>. The read clock source signal generator 262 outputs a read clock source signal RCLKENb<0:3> used for generating a read clock RCLK. The port selection source signal generator 263 outputs a port selection source signal DOUTEN_P<0:3> used for generating a port selection signal DRVENPb<0:3>.

The pipe latch control source signal generator 261 includes two transmission gates TG14 and TG15 and a 33th inverter INV33. The 14th transmission gate TG14 transmits the first output enable signal OE5 in response to a column address strobe latency (CL) signal CL3. The CL signal CL3 is used for controlling an output of the read data that is outputted after three clock periods of a system clock from input of the read command CASPRD. The 15th transmission gate TG15 transmits the third output enable signal OE15 in response to the CL signal CL3. The 33th inverter INV33 inverts one of outputs of the 14th and 15th transmission gates TG14 and TG15 and outputs the pipe latch control source signal POUTENb<0:3>.

The read clock source signal generator 262 includes two transmission gates TG18 and TG19 and a 35th inverter. The 18th transmission gate TG18 transmits the second output enable signal OE10 in response to the CL signal CL3. The 19th transmission gate TG19 transmits the fourth output enable signal OE20 in response to the CL signal CL3. The 35th inverter INV35 inverts one of outputs of the 18th and 19th transmission gates TG18 and TG19 and outputs the read clock source signal RCLKENb<0:3>.

The port selection source signal generator 263 includes two transmission gates TG16 and TG17 and a 34th inverter INV34. The 16th transmission gate TG16 transmits the third output enable signal OE15 in response to the CL signal CL3. The 17th transmission gate TG17 transmits the fifth output enable signal OE25 in response to the CL signal CL3. The 34th inverter INV34 inverts one of outputs of the 16th and 17th transmission gates TG16 and TG17 and outputs the port selection source signal DOUTEN_P<0:3>.

Figure 13:
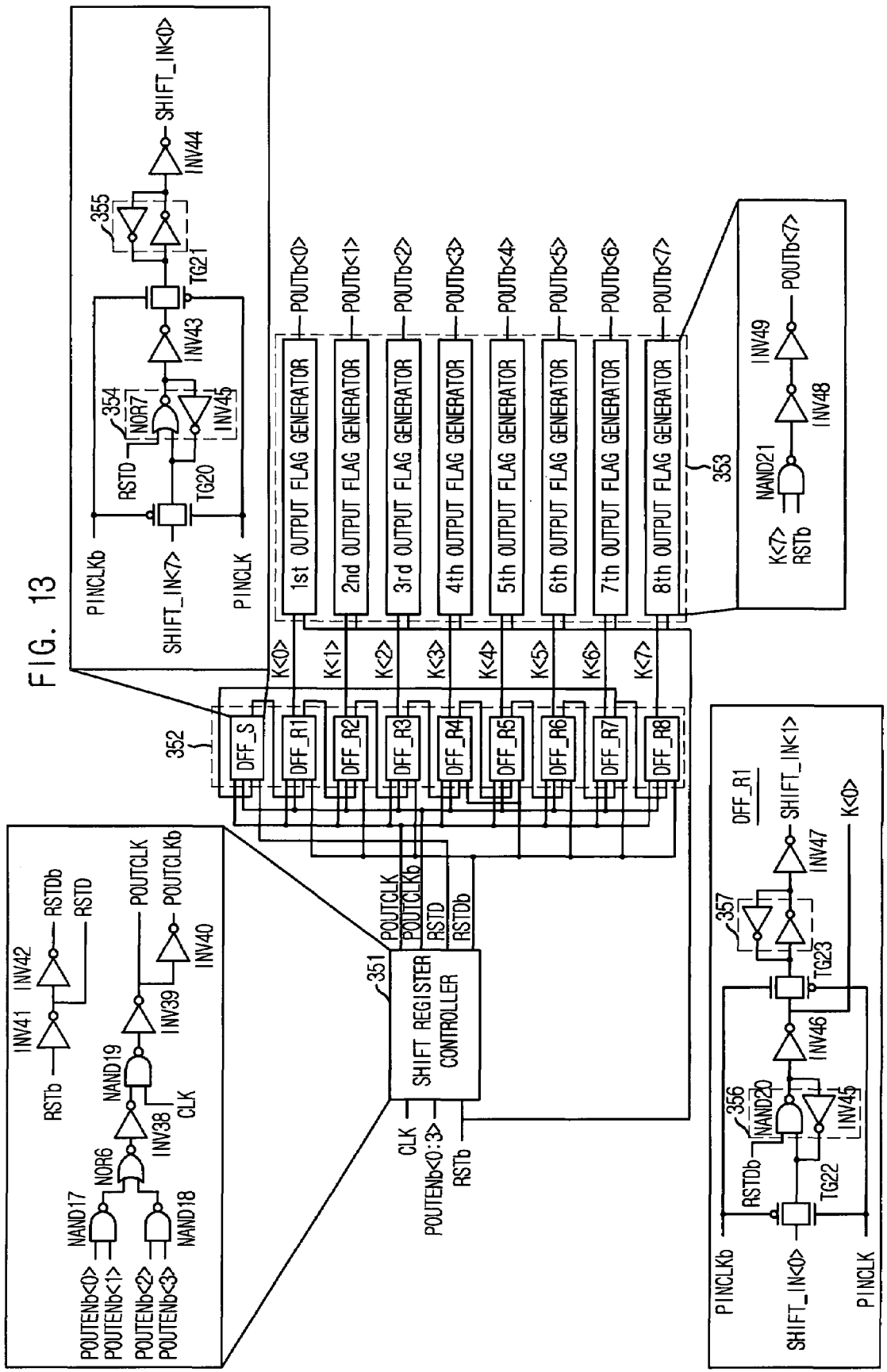
FIG. 13 is a schematic circuit diagram of a pipe latch output controller shown in FIG. 5.

FIG. 13 is a schematic circuit diagram of the pipe latch output controller 514 shown in FIG. 5.

The pipe latch output controller 514 includes a shift register controller 351, a shift register circuit 352, and an output flag generation unit 353.

The shift register controller 351 includes three NAND gates NAND17 to NAND19, a sixth NOR gate NOR6, and five inverters INV38 to INV42. The 17th NAND gate NAND17 logically combines the first and the second bits POUTENb<0:1> of the pipe latch control source signal POUTENb<0:3>. The 18th NAND gate NAND18 logically combines the third and the fourth bits POUTENb<2:3> of the pipe latch control source signal POUTENb<0:3>. The sixth NOR gate NOR6 logically combines outputs of the 17th and 18th NAND gates NAND17 and NAND18. The 38th inverter INV38 inverts an output of the sixth NOR gate NOR6. The 19th NAND gate NAND19 logically combines an output of the 38th inverter INV38 and the clock signal CLK. The 39th inverter INV39 inverts an output of the 19th NAND gate NAND19 and outputs a first pipe latch control clock signal POUTCLK. The 40th inverter INV40 inverts an output of the 39th inverter INV39 and outputs a second pipe latch control clock signal POUTCLKb. Herein, the first and the second pipe latch control clock signals POUTCLK and POUTCLKb toggles during four clocks after the CL signal CL3 is activated. The 41th inverter INV41 inverts the reset signal RSTb and outputs an inverted reset signal RSTD. The 42th inverter INV42 inverts an output of the 41th inverter INV41 and outputs a delayed reset signal RSTDb.

The shift register circuit 352 includes nine flip-flops DFF_S and DFF_R1 to DFF_R8. The flip-flop DFF_S includes two transmission gates TG20 and TG21, two latches 354 and 355 and two inverters INV43 and INV44. The 20th transmission gate TG20 transmits eighth shift signal SHIFT_IN<7> outputted from the seventh R flip-flop DFF_R7 in response to the first and the second pipe latch control clocks POUTCLK and POUTCLKb. The 15th latch 354 latches and resets an output of the 20th transmission gate TG20 in response to the inverted reset signal RSTD. The 15th latch 354 includes a seventh NOR gate NOR7, logically combing the output of the 20th transmission gate TG20 and the inverted reset signal RSTD, and a 45th inverter for inverting an output of the seventh NOR gate NOR7. The 43th inverter INV43 inverts the output of the seventh NOR gate NOR7. The 21th transmission gate TG21 transmits an output of the 43th inverter INV43 in response to the first and the second pipe latch control clocks POUTCLK and POUTCLKb. The 16th latch 355 latches an output of the 21th transmission gate TG21. The 44th inverter INV44 inverts an output of the 16th latch 355 and outputs a first shift signal SHIFT_IN<0>. The first R flip-flop DFF_R1 includes two transmission gates TG22 and TG23, two latches 356 and 357, and two inverters INV46 and INV47. The 22th transmission gate TG22 transmits the first shift signal SHIFT_IN<0> in response to the first and the second pipe latch control clocks POUTCLK and POUTCLKb. The 17th latch 356 latches and resets an output of the 22th transmission gate TG22 in response to the delayed reset signal RSTDb. The 17th latch 356 includes a 20th latch, logically combining the delayed reset signal RSTDb and an output of the 22th transmission gate TG22, and a 45th inverter INV45, inverting an output of the 20th NAND gate NAND20. The 46th inverter INV46 inverts an output of the 20th NAND gate NAND20 and outputs a first output flag source K<0>. The 23th transmission gate TG23 transmits an output of the 46th inverter INV46, i.e., the first output flag source K<0>, in response to the first and the second pipe latch control clocks POUTCLK and POUTCLKb. The 18th latch 357 latches an output of the 23th transmission gate TG23. The 47th inverter INV47 inverts an output of the 18th latch 357 and outputs a second shift signal SHIFT_IN<1>. The other R flip-flops DFF_R2 to DFF_R8 have similar structures as the first R flip-flop DFF_R1 and respectively output the output flag sources K<1:7> and the shift signals SHIFT_IN<2:8>.

The output flag generation unit 353 logically combines the output flag sources K<0:7> and the reset signal RSTb and generates the pipe latch output control signal POUTb<0:7>. The output flag generation unit 353 includes eight output flag generators for each bit of the output flag sources K<0:7>. The eight output flag generators have similar structures. For example, the eighth output flag generator includes a 21th NAND gate NAND21 and two inverters INV48 and INV49. The 21th NAND gate NAND21 logically combines the eighth output flag source K<7> and the reset signal RSTb. The 48th inverter INV48 inverts an output of the 21th NAND gate NAND21. The 49th inverter INV49 inverts an output of the 48th inverter INV48 and outputs the eighth pipe latch output control signal POUTb<7>.

Figure 14:
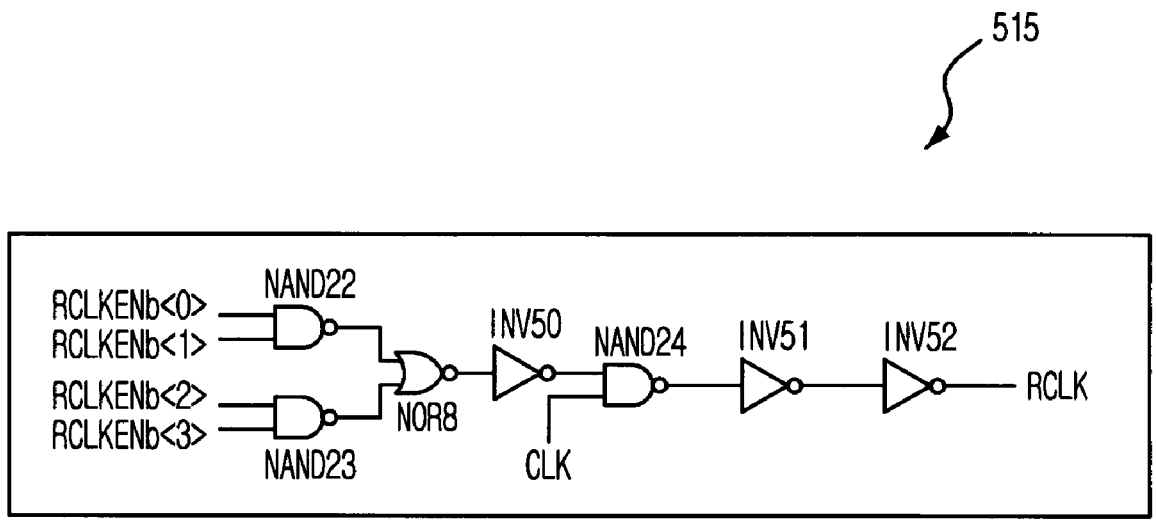
FIG. 14 is a schematic circuit diagram of a read clock generator shown in FIG. 5.

FIG. 14 is a schematic circuit diagram of the read clock generator 515 shown in FIG. 5.

The read clock generator 515 includes three NAND gates NAND22 to NAND24, an eighth NOR gate NOR8, and three inverters INV50 to INV52. The 22th NAND gate NAND22 logically combines the first and the second bits RCLKENb<0:1> of the read clock source signal RCLKENb<0:3>. The 23th NAND gate NAND23 logically combines the third and the fourth bits RCLKENb<2:3> of the read clock source signal RCLKENb<0:3>. The eighth NOR gate NOR8 logically combines outputs of the 22th and the 23th NAND gates NAND22 and NAND23. The 50th inverter INV50 inverts an output of the eighth NOR gate NOR8. The 24th NAND gate NAND24 logically combines an output of the 50th inverter INV50 and the clock signal CLK. The 51th and the 52th inverters INV51 and INV52 drive an output of the 24th NAND gate NAND24 and outputs the read clock RCLK.

Figure 15:
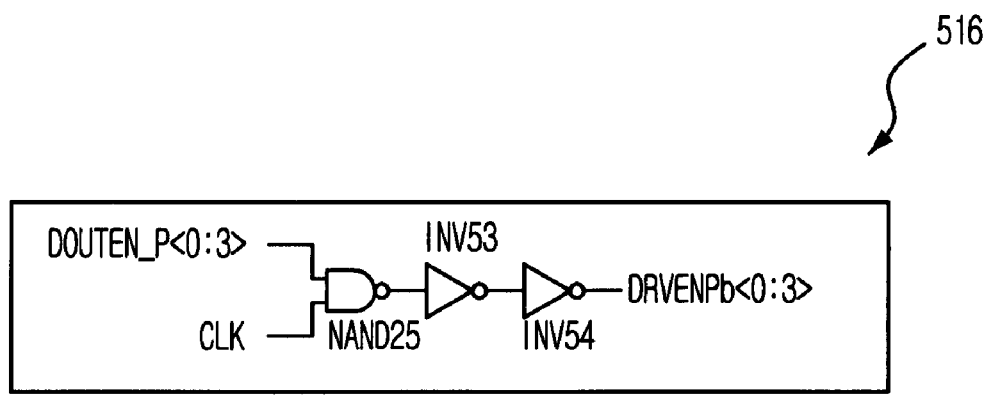
FIG. 15 is a schematic circuit diagram of a port selection signal generator 516 shown in FIG. 5.

FIG. 15 is a schematic circuit diagram of the port selection signal generator 516 shown in FIG. 5.

The port selection signal generator 516 includes a 25th NAND gate NAND25 and two inverters INV53 and INV54. The 25th NAND gate NAND25 logically combines the port selection source signal DOUTEN_P<0:3> and the clock signal CLK. The inverters INV53 and INV54 drives an output of the 25th NAND gate NAND25 and generates the port selection signal DRVENPb<0:3>.

Figure 16:
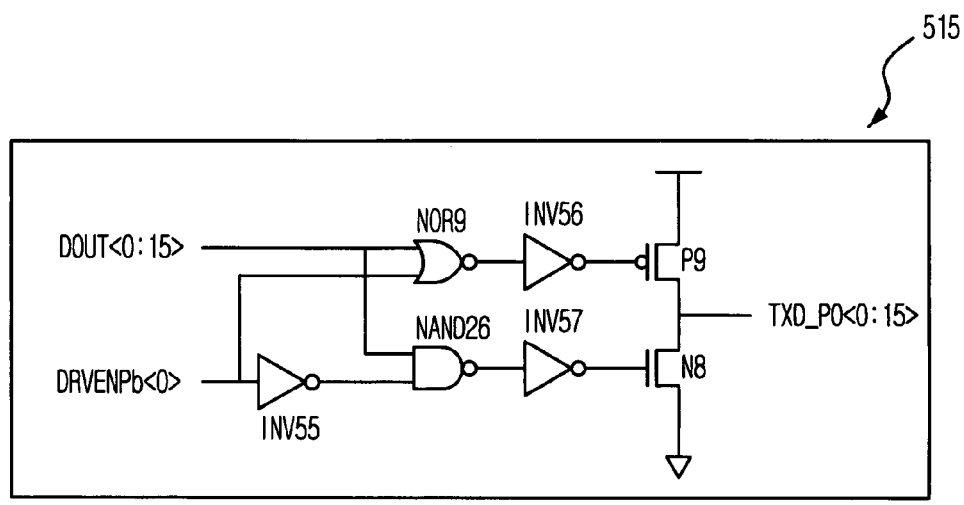
FIG. 16 is a schematic circuit diagram of the port transmission unit 518 shown in FIG. 5.

FIG. 16 is a schematic circuit diagram of the port transmission unit 518 shown in FIG. 5.

The port transmission unit 518 transmits the read data DOUT<0:15> outputted from the temporal store unit 517 to the corresponding ports PORT0 to PORT3 in response to the port selection signal DRVENPb<0:3>. The port transmission unit 518 includes a plurality number of read data transmitters corresponding to the ports. In case of this embodiment, therefore, four read data transmitters are included in the port transmission unit 518. The four read data transmitters have similar structures. For example, the first read data transmitter includes three inverters INV55 to INV57, a ninth NOR gate NOR9, a 26th NAND gate NAND26, a ninth PMOS transistor P9, and an eighth NMOS transistor N8. The ninth NOR gate NOR9 logically combines the read data DOUT<0:15> and the port selection signal DRVENPb<0:3>. The 55th inverter INV55 inverts the port selection signal DRVENPb<0:3>. The 26th NAND gate NAND26 logically combines the read data DOUT<0:15> and an output of the 55th inverter INV55. The 56th inverter INV56 inverts an output of the ninth NOR gate NOR9. The 57th inverter INV57 inverts an output of the 26th NAND gate NAND26. The ninth PMOS transistor P9, connected between the power supply voltage VDD terminal and a fourth output terminal, receives an output of the 56th inverter INV56 through its gate. The eighth NMOS transistor N8, connected between the fourth output terminal and the ground voltage VSS terminal, receives an output of the 57th inverter INV57 through its gate. A signal loaded at the fourth output terminal is the first port read data TXD_R0<0:15> transmitted to a transmitter of the first port PORT0.

Figure 17:
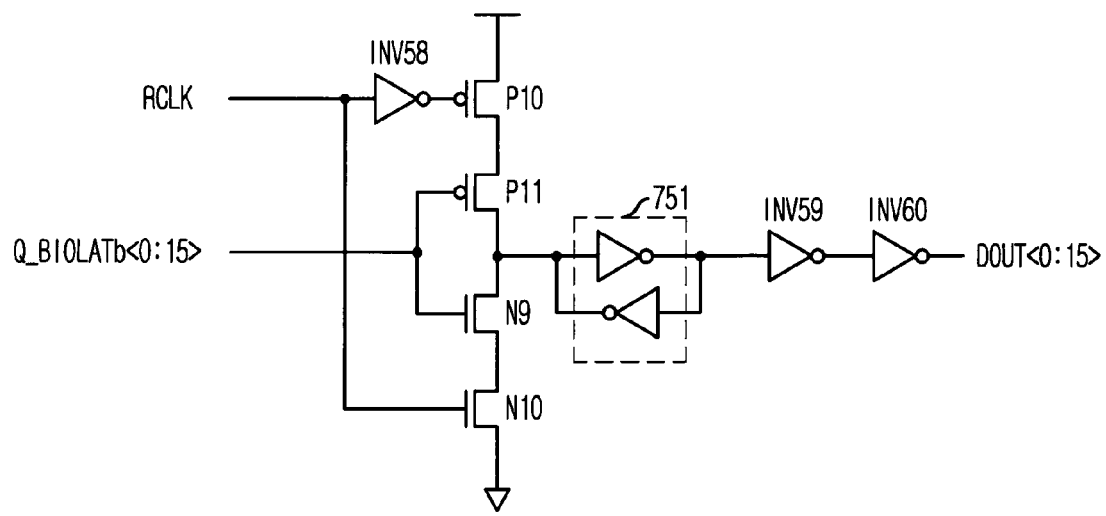
FIG. 17 is a schematic circuit diagram of a temporal store unit shown in FIG. 5.

FIG. 17 is a schematic circuit diagram of the temporal store unit 517 shown in FIG. 5.

The temporal store unit 517 stores the pipe latch read data Q_BIOLATb<0:15> outputted from the pipe latch unit 508 in response to the read clock RCLK. The temporal store unit 517 includes three inverters INV58 to INV60, two PMOS transistors P10 and P11, two NMOS N9 and N10, and a 19th latch 751. The 58th inverter INV58 inverts the read clock RCLK. The 10th PMOS transistor P10, connected between the power supply voltage VDD terminal and the 11th PMOS transistor P11, receives an output of the 58th inverter INV58 through its gate. The 11th PMOS transistor P11 and the ninth NMOS transistor N9 receive the pipe latch read data Q_BIOLATb<0:15> through their gates. The 11th PMOS transistor P11 is connected between the 10th PMOS transistor P10 and a fifth output terminal. The ninth NMOS transistor N9 is connected between the fifth output terminal and the 10th NMOS transistor N10. The 10th NMOS transistor N10, connected between the ninth NMOS transistor N9 and the ground voltage VSS terminal, receives the read clock RCLK through its gate. The 19th latch 751 latches a signal loaded at the fifth output terminal. The 59th and 60th inverters INV59 and INV60 drive an output of the 19th latch 751 and output the read data DOUT<0:15>.

The pipe latch unit 508 latches first to fourth I/O read data Q0BIO<0:15> to Q3BIO<0:15> in response to the pipe latch input control signals PINb<0:1> outputted from the pipe latch input controller 512. Further, the pipe latch unit 508 outputs the first to fourth I/O read data Q0BIO<0:15> to Q3BIO<0:15> as the pipe latch read data Q_BIOLATb<0:15> in response to the pipe latch output control signal POUTb<0:7>. The pipe latch unit 508 includes first to fourth pipe latch circuits, each of which receives corresponding one of the first to the fourth I/O read data Q0BIO<0:15> to Q3BIO<0:15>. The first to the fourth pipe latch circuits have similar structures except for their input signal. In detail, the first pipe latch circuit receives the first I/O read data Q0BIO<0:15>, the pipe latch input control signals PINb<0:1>, and two pipe latch control signals POUTb<0,4>. The second pipe latch circuit receives the second I/O read data Q1BIO<0:15>, the pipe latch input control signals PINb<0:1>, and two pipe latch control signals POUTb<1,5>. The third pipe latch circuit receives the third I/O read data Q2BIO<0:15>, the pipe latch input control signals PINb<0:1>, and two pipe latch output control signal POUTb<2,6>. The fourth pipe latch circuit receives the fourth I/O read data Q3BIO<0:15>, the pipe latch input control signals PINb<0:1>, and two pipe latch output control signal POUTb<3,7>.

Figure 18A:
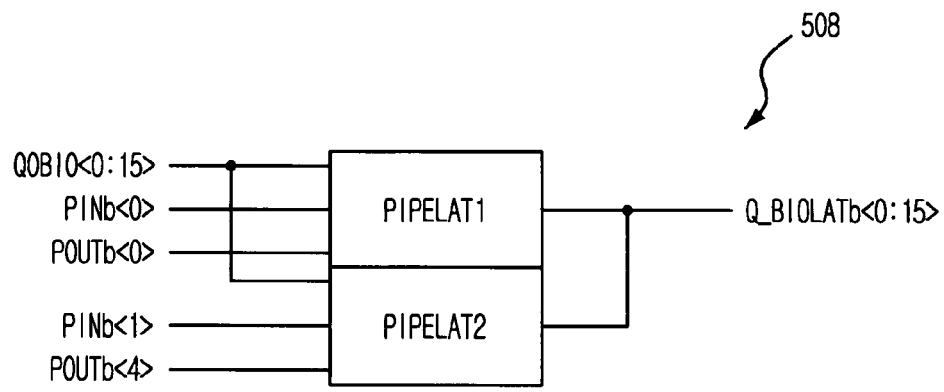
FIG. 18A is a block diagram of a first pipe latch circuit included in a pipe latch unit shown in FIG. 5.

FIG. 18A is a block diagram of the first pipe latch circuit included in the pipe latch unit 508 shown in FIG. 5.

The first pipe latch circuit includes first and second pipe latches PIPELAT1 and PIPELAT2. The first pipe latch PIPELAT1 latches the first I/O read data Q0BIO<0:15> in response to the first pipe latch input control signal PINb<O> and outputs the first I/O read data Q0BIO<0:15> as the pipe latch read data Q_BIOLATb<0:15> in response to the first pipe latch output control signal POUTb<0>. The second pipe latch PIPELAT2 latches the first I/O read data Q0BIO<0:15> in response to the second pipe latch input control signal PINb<1> and outputs the first I/O read data Q0BIO<0:15> as the pipe latch read data Q_BIOLATb<0:15> in response to the fourth pipe latch output control signal POUTb<4>. The first and the second pipe latches PIPELAT1 and PIPELAT2 also have similar structures.

Figure 18B:
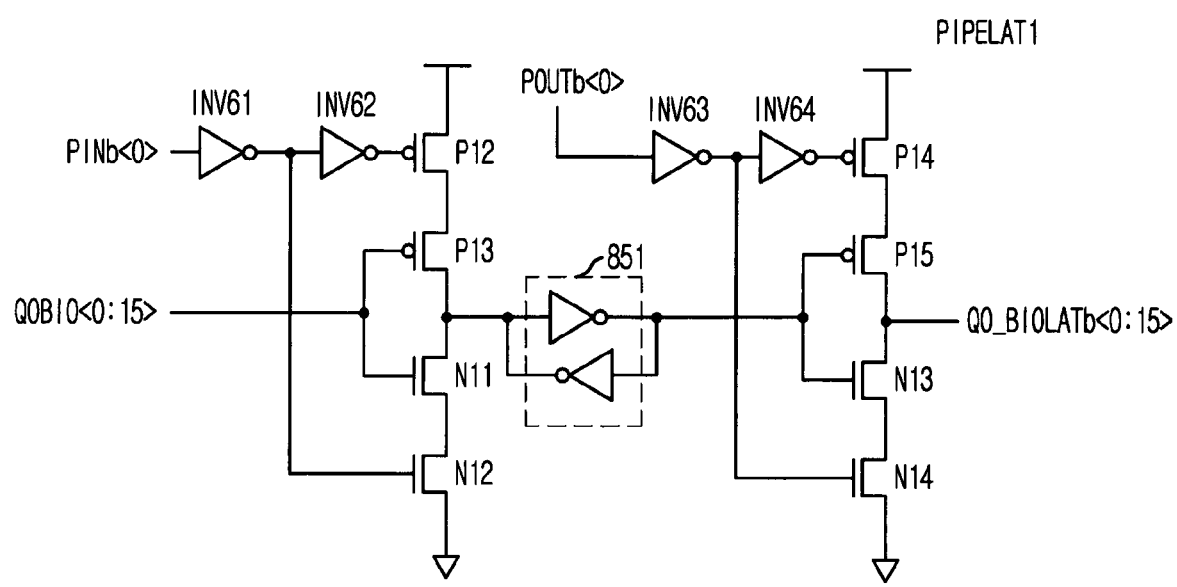
FIG. 18B is a schematic circuit diagram of a first pipe latch shown in FIG. 18A.

FIG. 18B is a schematic circuit diagram of the first pipe latch PIPELAT1 shown in FIG. 18A.

The first pipe latch PIPELAT1 includes four inverters INV61 to INV64, four PMOS transistors P12 to P15, four NMOS transistors N11 to N14, and a 20th latch 851. The 61th inverter InV61 inverts the first pipe latch input control signal PINb<0>. The 62th inverter INV62 inverts an output of the 61th inverter INV61. The 12th PMOS transistor P12, connected between the power supply voltage VDD terminal and the 13th PMOS transistor P13, receives an output of the 62th inverter INV62 through its gate. The 13th PMOS transistor P13 and the 11th NMOS transistor N11 receive the first I/O read data Q0BIO<0:15> through their gates. The 13th PMOS transistor P13 is connected between the 12th PMOS transistor P12 and a sixth output terminal. The 11th NMOS transistor N11 is connected between the sixth output terminal and the 12th NMOS transistor N12. The 12th NMOS transistor, connected between the 11th NMOS transistor N11 and the ground voltage VSS terminal, receives an output of the 61th inverter INV61 through its gate. The 20th latch 851 latches a signal loaded at the sixth output terminal. The 63th inverter INV63 inverts the first pipe latch output control signal POUTb<0>. The 64th inverter INV64 inverts an output of the 63th inverter INV63. The 14th PMOS transistor P14, connected between the power supply voltage VDD terminal and the 15th PMOS transistor P15, receives an output of the 64th inverter INV64 through its gate. The 15th PMOS transistor P15 and the 13th NMOS transistor N13 receive an output of the 20th latch 851 through their gates. The 15th PMOS transistor P15 is connected between the 14th PMOS transistor P14 and a seventh output terminal. The 13th NMOS transistor N13 is connected between the seventh output terminal and the 14th NMOS transistor N14. The 14th NMOS transistor N14, connected between the 13th NMOS transistor N13 and the ground voltage VSS terminal, receives the output of the 63th inverter INV63. The signal loaded at the seventh output terminal is outputted as the pipe latch read data Q_BIOLATb<0:15>.

Figure 19:
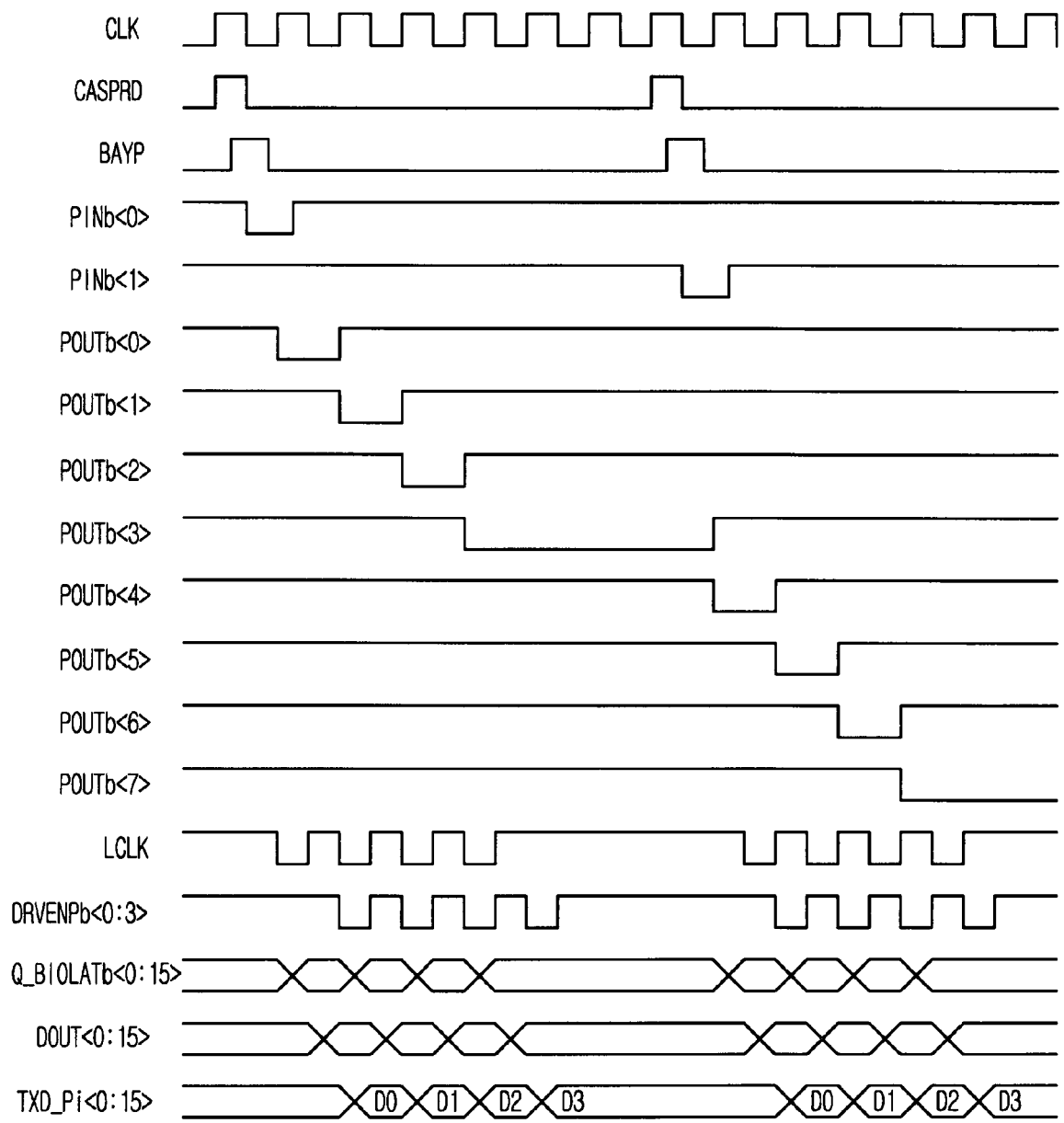
FIG. 19 is a timing diagram illustrating an operation of the read circuit shown in FIG. 5.

FIG. 19 is a timing diagram illustrating an operation of the read circuit shown in FIG. 5.

After the read command CASPRD is inputted, the pipe latch input control signals PINb<0:1> and the output flag YBST_OE are generated in response to the read command CASPRD. The pipe latch output control signals POUTb<0:7> are sequentially generated in response to the output flag YBST_OE. Activation period of each pipe latch output control signals POUTb<0:7> are not overlapped each other. The pipe latch read data Q_BIOLATb<0:15> is generated in response to the pipe latch output control signals POUTb<0:7>. The read data DOUT<0:15> is outputted from the temporal store unit 517 temporal store unit 517 in response to the read clock RCLK outputted from the read clock generator 515. The read data DOUT<0:15> is outputted as the port read data TXD_Pi<0:15> in response to the port selection signal DRVENPb<0:3>. That is, the read circuit generates the read clock RCLK toggling for four clocks and transmits the port read data TXD_Pi<0:15> to the ports PORT0 to PORT3 in synchronism with the read clock RCLK.

As mentioned above, the read circuit in accordance with the present invention provides a reliable read operation by using the read clock toggling for four clocks. Therefore, the present invention obtains a reliable multi-port memory device.

While the present invention has been described with respect to the specific embodiments, it will be apparent to those skilled in the art that various changes and modifications may be made without departing from the spirit and scope of the invention as defined in the following claims.

What is claimed is:

1. A multi-port memory device, comprising:
   a plurality of ports;
   a plurality of bank control units;
   a plurality of banks, each of which is connected to a corresponding one of the bank control units;
   a read clock generation unit for generating a read clock in response to a read command;
   a data transmission unit for transmitting a read data from the banks to a corresponding one of the ports in response to the read clock;
   a column address generation unit for generating a column address;
   an input/output (I/O) sense amplification unit for amplify the read data;
   a pipe latch unit for latching an output of the I/O sense amplification unit;
   an I/O sense amplifier control unit for controlling the I/O sense amplification unit in response to the read command and a write command; and a pipe latch input control unit for controlling the output of the I/O sense amplification unit to the pipe latch unit, wherein every bank control unit is connected to all of the ports.

2. The multi-port memory device as recited in claim 1, wherein the read clock generation unit includes:
- a reception unit for receiving parallel data from the ports and generating first and second serial data frames in response to a port information signal;
- a command decoder for generating an internal command by decoding the first serial data frame;
- a read data output flag generation unit for generating a read data output flag used for outputting the read data through the bank control units; and
- a read data output control unit for generating a read data output control signal used for outputting the read data to the ports, wherein the port information signal indicates which port accesses the banks.

3. The multi-port memory device as recited in claim 2, wherein the read data output control unit includes a pipe latch output control unit for generating a pipe latch output control signal for controlling an output operation of the pipe latch unit.

4. The multi-port memory device as recited in claim 3, wherein the pipe latch output control unit includes:
- a shift register controller for generating a shift register control signal;
- a shift register for generating a plurality of source signals sequentially activated in response to the shift control signal; and
- a pipe latch output control signal output unit for outputting the pipe latch output control signal based on the source signals.

5. The multi-port memory device as recited in claim 4, wherein the shift register controller includes:
- a first NAND gate for logically combining the first and the second bits of the pipe latch output control enable signal;
- a second NAND gate for logically combining the third and the fourth bits of the pipe latch output control enable signal;
- a first NOR gate for logically combining outputs of the first and the second NAND gates;
- a first inverter for inverting an output of the first NOR gate;
- a third NAND gate for logically combining an output of the first inverter and a clock signal;
- a second inverter for inverting an output of the third NAND gate and outputting a first transmission signal; and
- a third inverter for inverting the first transmission signal and outputting a second transmission signal.

6. The multi-port memory device as recited in claim 5, wherein the shift register includes a single start flip-flop and eight shift flip-flops.

7. The multi-port memory device as recited in claim 6, wherein the start flip-flop includes:
- a first transmission gate for transmitting an eighth shift signal outputted from the seventh shift flip-flop in response to the first and the second transmission signals;
- a first latch for latching and resetting an output of the first transmission gate in response to a first reset signal;
- a fourth inverter for inverting an output of the first reset circuit;
- a second transmission gate for transmitting an output of the fourth inverter in response to the first and the second transmission signals;
- a second latch for latching an output of the second transmission gate; and
- a fifth inverter for inverting an output of the second latch and outputting a first shift signal.

8. The multi-port memory device as recited in claim 7, wherein the first latch includes:
- a second NOR gate for logically combining the output of the first transmission gate and the first reset signal; and
- a sixth inverter, whose output terminal is connected to an output terminal of the first transmission gate, for inverting an output of the second NOR gate.

9. The multi-port memory device as recited in claim 6, wherein the first shift flip-flop includes:
- a first transmission gate for transmitting a first shift signal outputted from the start flip-flop in response to the first and the second transmission signals;
- a first latch for latching and resetting an output of the first transmission gate in response to a second reset signal;
- a fourth inverter for inverting an output of the first latch and outputting a first pipe latch output control source signal;
- a second transmission gate for transmitting the first pipe latch output control source signal in response to the first and the second transmission signals;
- a second latch for latching an output of the second transmission gate; and
- a fifth inverter for inverting an output of the second latch and outputting a shift signal.

10. The multi-port memory device as recited in claim 9, wherein the first latch includes:
- a fourth NAND gate for logically combining the output of the first transmission gate and the second reset signal; and
- a sixth inverter, whose output terminal is connected to an output terminal of the first transmission gate, for inverting an output of the fourth NAND gate.

11. The multi-port memory device as recited in claim 6, wherein the pipe latch output control signal output unit includes a plurality of pipe latch output control signal generators corresponding to the shift flip-flops.

12. The multi-port memory device as recited in claim 11, wherein the eighth pipe latch output control signal generator includes:
- a fourth NAND gate for logically combining the eighth pipe latch output control source signal and a second reset signal; and
- fourth and fifth inverters for buffering an output of the fourth NAND gate and outputting an eighth bit of the pipe latch output control signal.

13. The multi-port memory device as recited in claim 2, wherein the read data output control unit includes:
- an initial control signal generation unit for generating a port selection source signal and a read clock source signal in response to the read data output flag;
- a read clock generation circuit for generating the read clock in response to the read clock source signal; and
- a port selection signal generation unit for generating the port selection signal in response to the port selection source signal.

14. The multi-port memory device as recited in claim 13, wherein the initial control signal generation unit includes:
- an initial signal generation unit for generating a first source signal based on the port information signal, the read data output flag, and the read command;
- a flip-flop unit for generating second to fifth source signals based on the first source signal; and
- an initial control signal output unit for sequentially outputting the first to the fifth source signals in response to a column address strobe (CAS) latency signal after the read command is activated, wherein the CAS latency signal controls the read data to be outputted after a predetermined clock periods of a clock signal from input of the read command.

15. The multi-port memory device as recited in claim 14, wherein the port information signal is a four bit signal and each bit of the port information signal is activated when a corresponding port is selected.

16. The multi-port memory device as recited in claim 15, wherein the initial control signal generation unit is controlled by a delayed clock signal and an inverted clock signal of the clock signal.

17. The multi-port memory device as recited in claim 16, wherein the initial signal generation unit includes:
a first inverter for inverting the read data output flag;
a first NAND gate for logically combining an output of the first inverter and the clock signal;
a first delay circuit for delaying an output of the first NAND gate for a predetermined time;
a first NOR gate for logically combining outputs of the first NAND gate and the first delay circuit;
a second NAND gate for logically combining the bank information and the read command;
a second inverter for inverting an output of the second NAND gate;
a third inverter for inverting an output of the second inverter;
a second delay circuit for delaying an output of the third inverter for a predetermined time;
a third NAND gate for logically combining outputs of the first NOR gate, the second delay circuit, and the third inverter;
a first PMOS transistor, connected to a power supply voltage terminal, for receiving an output of the third NAND gate through its gate;
a second PMOS transistor, connected between the first PMOS transistor and a second output terminal, for receiving the output of the second inverter through its gate;
a first NMOS transistor, connected between the second output terminal and a ground voltage terminal, for receiving the output of the second inverter through its gate;
a third PMOS transistor, connected between the power supply voltage terminal and the second output terminal, for receiving a reset signal through its gate;
a first latch for latching a signal loaded at the second output terminal;
a first transmission gate for transmitting an output of the first latch in response to the delayed clock signal;
a second latch for latching and resetting an output of the first transmission gate in response to the reset signal; and
a fourth inverter for inverting an output of the second latch and outputting the first source signal.

18. The multi-port memory device as recited in claim 17, wherein the flip-flop unit includes:
a first flip-flop for transmitting the first source signal in response to the delayed clock signal and the inverted clock signal and generating the second and third source signals; and
a second flip-flop for transmitting the third source signal in response to the delayed clock signal and the inverted clock signal and outputting the fourth and the fifth source signals.

19. The multi-port memory device as recited in claim 18, wherein the first flip-flop includes:
a second transmission gate for transmitting the first source signal in response the delayed clock signal and the inverted clock signal;
a third latch for latching and resetting an output of the second transmission gate in response to the reset signal;
a fifth inverter for inverting an output of the third latch and outputting the second source signal;
a third transmission gate for transmitting the second source signal in response to the delayed clock signal and the inverted clock signal;
a fourth latch for latching an output of the third transmission gate; and
a sixth inverter for inverting an output of the fourth latch and outputting the third source signal.

20. The multi-port memory device as recited in claim 19, wherein the second flip-flop includes:
a fourth transmission gate for transmitting the third source signal in response to the delayed clock signal and the inverted clock signal;
a fifth latch for latching and resetting an output of the fourth transmission gate in response to the reset signal;
a seventh inverter for inverting an output of the fifth latch and outputting the fourth source signal;
a fifth transmission gate for transmitting the fourth source signal in response to the delayed clock signal and the inverted clock signal;
a sixth latch for latching an output of the fifth transmission gate; and
an eighth inverter for inverting an output of the sixth latch and outputting the fifth source signal.

21. The multi-port memory device as recited in claim 20, wherein the initial control signal output unit includes:
a first output unit for outputting a pipe latch output control enable signal;
a second output unit for outputting the read clock source signal; and
a third output unit for outputting the port selection source signal, wherein the pipe latch output control enable signal, and the read clock source signal, and the port selection source signal are four bit signal corresponding to the port information signal.

22. The multi-port memory device as recited in claim 21, wherein the first output unit includes:
a sixth transmission gate for transmitting the first source signal in response to the CAS latency signal;
a seventh transmission gate for transmitting the third source signal in response to the CAS latency signal; and
a ninth inverter for inverting one of outputs of the sixth and the seventh transmission gates and outputting the pipe latch output control enable signal.

23. The multi-port memory device as recited in claim 21, wherein the first output unit includes:
a sixth transmission gate for transmitting the second source signal in response to the CAS latency signal;
a seventh transmission gate for transmitting the fourth source signal in response to the CAS latency signal; and
a ninth inverter for inverting one of outputs of the sixth and the seventh transmission gates and outputting the read clock source signal.

24. The multi-port memory device as recited in claim 21, wherein the first output unit includes:
a sixth transmission gate for transmitting the third source signal in response to the CAS latency signal;
a seventh transmission gate for transmitting the fifth source signal in response to the CAS latency signal; and a ninth inverter for inverting one of outputs of the sixth and the seventh transmission gates and outputting the port selection source signal.

25. The multi-port memory device as recited in claim 24, wherein the read clock generation circuit includes:
    a fourth NAND gate for logically combining the first and the second bits of the read clock source signal;
    a fifth NAND gate for logically combining the third and the fourth bits of the read clock source signal;
    a second NOR gate for logically combining outputs of the fourth and the fifth NAND gates;
    a tenth inverter for inverting an output of the second NOR gate;
    a sixth NAND gate for logically combining an output of the tenth inverter and the clock signal;
    tenth and eleventh inverters for buffering an output of the sixth NAND gate and outputting the read clock.

26. The multi-port memory device as recited in claim 25, wherein the port selection signal generation unit includes:
    a seventh NAND gate for logically combining the port selection source signal and the clock signal; and
    twelfth and thirteenth inverters for buffering an output of the seventh NAND gate and outputting the port selection signal.

27. The multi-port memory device as recited in claim 2, wherein the reception unit includes:
    a multiplexer unit for selecting one of the parallel data in response to the port information signal; and
    a first flip-flop unit for transmitting an output of the multiplexer unit in response to a clock signal.

28. The multi-port memory device as recited in claim 27, wherein the multiplexer unit includes a plurality of multiplexers, each of which corresponds to a bit of the parallel data.

29. The multi-port memory device as recited in claim 28, wherein the first flip-flop unit includes a plurality of flip-flops.

30. The multi-port memory device as recited in claim 29, wherein each of the plurality of flip-flops includes:
    a first inverter for inverting an output of the multiplexer unit;
    a first transmission gate for transmitting an output of the first inverter in response to the clock signal;
    a first latch for latching an output of the first transmission gate and outputting the first serial data frame;
    a second inverter for inverting an output of the first latch;
    a second transmission gate for transmitting an output of the second inverter in response to the clock signal; and
    a second latch for latching an output of the second transmission gate and outputting the second serial data frame.

31. The multi-port memory device as recited in claim 2, wherein the command decoder includes:
    an active command generator for generating an active command;
    a read command generator for generating the read command;
    a write command generator for generating a write command;
    a precharge command generator for generating a precharge command; and
    a refresh command generator for generating a refresh command.

32. The multi-port memory device as recited in claim 31, wherein the read command generator includes:
    a first inverter for inverting an active bit of the first serial data frame;
    a first NAND gate for logically combining an output of the first inverter and a command bit of the first serial data frame;
    a second inverter for inverting a write bit of the first serial data frame;
    a third inverter for inverting a command escape bit of the first serial data frame;
    a second NAND gate for logically combining outputs of the second and third inverters and a read bit of the first serial data frame;
    a first NOR gate for logically combining outputs of the first and the second NAND gates; and
    a third NAND gate for logically combining an output of the first NOR gate and a clock signal.

33. The multi-port memory device as recited in claim 2, wherein the read data output flag generation unit includes:
    a start circuit for generating a start signal in response to the read command;
    a second flip-flop unit for generating a plurality of control flags based on an output of the start signal; and
    a read data output flag output unit for outputting the read data output flag by logically combining the start signal and the control flags.

34. The multi-port memory device as recited in claim 33, wherein the start circuit includes:
    a first inverter for inverting the start signal;
    a first NAND gate for logically combining an output of the first inverter a first PMOS transistor, connected between a power supply voltage terminal and a first output terminal, for receiving an output of the first NAND gate through its gate;
    a first NMOS transistor, connected to the first output terminal, for receiving the output of the first NAND gate through its gate;
    a second NMOS transistor, connected between the first NMOS transistor and a ground voltage terminal, for receiving the read command through its gate;
    a first latch for latching a signal loaded at the first output terminal;
    a first transmission gate for transmission an output of the first latch in response to a clock signal; and
    a second latch for latching an output of the first transmission gate and outputting the start signal.

35. The multi-port memory device as recited in claim 33, wherein the second flip-flop unit includes:
    a first flip-flop for generating first and second control flags based on the start signal; and
    a second flip-flop for generating third and fourth control flags based on the second control flag.

36. The multi-port memory device as recited in claim 35, wherein the first flip-flop includes:
    a first transmission gate for transmitting the start signal in response to a clock signal;
    a first latch for latching an output of the first transmission gate and outputting the first control flag;
    a second transmission gate for transmitting the first control flag in response to the clock signal; and
    a second latch for latching an output of the second transmission gate and outputting the second control flag.

37. The multi-port memory device as recited in claim 35, wherein the second flip-flop includes:
    a first transmission gate for transmitting the second control flag in response to a clock signal;
    a first latch for latching an output of the first transmission gate and outputting the third control flag;
    a second transmission gate for transmitting the third control flag in response to the control signal; and
    a second latch for latching an output of the second transmission gate and outputting the fourth control flag.

38. The multi-port memory device as recited in claim 35, the read data output flag output unit includes:
- a first inverter for inverting the first control flag;
- a first NAND for logically combining an output of the first inverter and the start signal; a second inverter for inverting the third control flag;
- a second NAND gate for logically combining the second and fourth control flags and an output of the second inverter;
- a first NOR gate for logically combining outputs of the first and the second NAND gates; and
- a third inverter for inverting an output of the first NOR gate and outputting the read data output flag.

39. The multi-port memory device as recited in claim 2, wherein the column address generation unit generates the column address based on a column address information stored in the first and the second serial data frames.

40. The multi-port memory device as recited in claim 39, wherein the column address generation unit includes:
- a write column address generation unit for generating a write column address used for a write operation; and
- a read column address generation unit for generating a read column address used for a read operation.

41. The multi-port memory device as recited in claim 40, wherein the write column address generation unit includes:
- a first transmission gate for transmitting the column address information stored in the first and the second serial data frames;
- a first latch for latching an output of the first transmission gate;
- a first inverter for inverting an output of the first latch;
- a first NMOS transistor, connected to a ground voltage terminal, for receiving an output of the first inverter through its gate;
- a second inverter for inverting a write operation flag activated when both write data and the write command are inputted;
- a first PMOS transistor, connected to a first output terminal, for receiving an output of the second inverter through its gate;
- a second NMOS transistor, connected between the first output terminal and the first NMOS transistor, for receiving the output of the second inverter through its gate;
- a second PMOS transistor, connected between a power supply voltage terminal and the first PMOS transistor, for receiving the output of the first inverter through its gate; and
- a second latch for latching a signal loaded at the first output terminal.

42. The multi-port memory device as recited in claim 41, wherein the read column address generation unit includes:
- a third NMOS transistor, connected to the ground voltage terminal, for receiving the column address information through its gate;
- a third inverter for inverting the read command;
- a third PMOS transistor, connected to a second output terminal, for receiving an output of the third inverter through its gate;
- a fourth NMOS transistor, connected between the second output terminal and the third NMOS transistor, for receiving the read command through its gate;
- a fourth PMOS transistor, connected between the power supply voltage terminal and the third PMOS transistor, for receiving the column address information through its gate; and
- a fourth latch for latching a signal loaded at the second output terminal.

43. The multi-port memory device as recited in claim 1, wherein the data transmission unit includes:
- a temporal store unit for storing an output of the pipe latch unit; and
- a port transmission unit for transmitting an output of the temporal store unit to the corresponding one of the ports in response to a port selection signal.

44. The multi-port memory device as recited in claim 43, wherein the port transmission unit includes four port transmission circuits.

45. The multi-port memory device as recited in claim 44, wherein each of the port transmission circuits includes:
- a first NOR gate for logically combining the read data and the port selection signal;
- a first inverter for inverting an output of the first NOR gate;
- a first PMOS transistor, connected between a power supply voltage terminal and an output terminal, for receiving an output of the first inverter through its gate;
- a second inverter for inverting the port selection signal;
- a first NAND gate for logically combining the read data and an output of the second inverter;
- a third inverter for inverting an output of the first NAND gate; and
- a first NMOS transistor, connected between the output terminal and a ground voltage terminal, for receiving an output of the third inverter through its gate.

46. The multi-port memory device as recited in claim 43, wherein the temporal store unit includes:
- a first NMOS transistor, connected to an output terminal, for receiving the output of the pipe latch unit through its gate;
- a first inverter for inverting the read clock;
- a first PMOS transistor, connected to a power supply voltage terminal, for receiving an output of the first inverter through its gate;
- a second NMOS transistor, connected between the first NMOS transistor and a ground voltage terminal, for receiving the read clock through its gate;
- a second PMOS transistor, connected between the first PMOS transistor and the output terminal, for receiving the output of the pipe latch unit through its gate;
- a first latch for latching a signal loaded at the output terminal; and
- second and third inverters for buffering an output of the first latch and outputting the read data.

47. The multi-port memory device as recited in claim 1, wherein the I/O sense amplifier control unit includes:
- an I/O sense amplifier source signal generation unit for generating an I/O sense amplifier source signal in response to the read command and the write command; and
- an I/O sense amplifier control signal output unit for outputting an I/O sense amplifier control signal in response to the I/O sense amplifier source signal.

48. The multi-port memory device as recited in claim 47, wherein the I/O sense amplifier source signal generation unit includes:
- a first NOR gate for logically combining the read command and the write command;
- a first NAND gate for logically combining outputs of the first NOR gate and a second NAND gate;
- a first delay circuit for delaying an output of the first NAND gate for a predetermined time;
- a first inverter for inverting an output of the first delay circuit;

the second NAND gate for logically combining outputs of the first NAND gate and the first inverter and reset signal;
a third NAND gate for logically combining the outputs of the first NAND gate and the first inverter; and
a second inverter for inverting an output of the third NAND gate and outputting the I/O sense amplifier source signal.

49. The multi-port memory device as recited in claim 1, wherein the pipe latch input control unit includes:
a flip-flop control signal generation unit for generating a flip-flop control signal in response to a pipe latch input control source signal outputted from the I/O sense amplifier control unit;
a flip-flop unit including two flip-flops; and
a pipe latch input control signal output unit for outputting a pipe latch input control signal by combining an output of the flip-flop unit and the pipe latch input control source signal.

50. The multi-port memory device as recited in claim 49, wherein the flip-flop control signal generation unit includes:
a first inverter for inverting a reset signal and outputting an inverted reset signal;
a second inverter for inverting the inverted reset signal and outputting a delayed reset signal;
a first NAND gate for logically combining the pipe latch input control source signal and the delayed reset signal and outputting a first flip-flop control signal; and
a third inverter for inverting the first flip-flop control signal and outputting a second flip-flop control signal.

51. The multi-port memory device as recited in claim 50, wherein the flip-flop unit includes:
a first flip-flop for transmitting an output of a second flip-flop in response to the first and the second flip-flop control signals and the reset signal; and
the second flip-flop for transmitting an output of the first flip-flop in response to the first and the second flip-flop control signals and the reset signal.

52. The multi-port memory device as recited in claim 51, wherein the first flip-flop includes:
a first transmission gate for transmitting the output of the second flip-flop in response to the first and the second flip-flop control signals;
a first latch for latching and resetting an output of the first transmission gate in response to the reset signal;
a fourth inverter for inverting an output of the first latch;
a second transmission gate for transmitting an output of the fourth inverter in response to the first and the second flip-flop control signals;
a second latch for latching an output of the second transmission gate; and
a fifth inverter for inverting an output of the second latch and outputting the output of the first flip-flop.

53. The multi-port memory device as recited in claim 52, wherein the first latch includes:
a second NAND gate for logically combining the output of the first transmission gate and the reset signal; and
a sixth inverter, whose output terminal is connected to an output terminal of the first transmission gate, for inverting an output of the second NAND gate.

54. The multi-port memory device as recited in claim 52, wherein the second flip-flop includes:
a third transmission gate for transmitting the output of the first flip-flop in response to the first and the second flip-flop control signals;
a third latch for latching and resetting an output of the third transmission gate in response to the inverted reset signal;
a sixth inverter for inverting an output of the third latch;
a fourth transmission gate for transmitting an output of the sixth inverter in response to the first and the second flip-flop control signals;
a fourth latch for latching an output of the fourth transmission gate; and
a seventh inverter for inverting an output of the fourth latch and outputting the output of the second flip-flop.

55. The multi-port memory device as recited in claim 54, wherein the third latch includes:
a first NOR gate for logically combining the output of the third transmission gate and the inverted reset signal; and
an eighth inverter, whose output terminal is connected to an output terminal of the third transmission gate, for inverting an output of the first NOR gate.

56. The multi-port memory device as recited in claim 55, wherein the pipe latch input control signal output unit includes:
a first pipe latch input control signal output unit for outputting a first pipe latch input control signal by combining the pipe latch input control source signal and the output of the first flip-flop; and
a second pipe latch input control signal output unit for outputting a second pipe latch input control signal by combining the pipe latch input control source signal and the output of the second flip-flop.

57. The multi-port memory device as recited in claim 56, wherein the first pipe latch input control signal output unit includes:
a second NAND gate for logically combining the output of the first flip-flop and the pipe latch input control source signal; and
ninth and tenth inverters for buffering an output of the second NAND gate and outputting a first bit of the pipe latch input control signal.

58. The multi-port memory device as recited in claim 57, wherein the second pipe latch input control signal output unit includes:
a third NAND gate for logically combining the output of the second flip-flop and the pipe latch input control source signal; and
eleventh and twelfth inverters for buffering an output of the third NAND gate and outputting a second bit of the pipe latch input control signal.

59. The multi-port memory device as recited in claim 1, wherein the pipe latch unit includes first to fourth pipe latch circuits.

60. The multi-port memory device as recited in claim 59, wherein the first pipe latch circuit includes:
a first pipe latch for latching an output of the I/O sense amplification unit in response to the first bit of the pipe latch input control signal and outputting the output of the I/O sense amplification unit in response to the first bit of the pipe latch output control signal; and
a second pipe latch for latching the output of the I/O sense amplification unit in response to the second bit of the pipe latch input control signal and outputting the output of the I/O sense amplification unit in response to the fifth bit of the pipe latch output control signal.

61. The multi-port memory device as recited in claim 60, wherein the first pipe latch includes:
a first inverter for inverting the first bit of the pipe latch input control signal;
a second inverter for inverting an output of the first inverter
a first PMOS transistor, connected to a power supply voltage terminal, for receiving an output of the second inverter through its gate;

a second PMOS transistor, connected between the first PMOS transistor and a first output terminal, for receiving the output of the I/O sense amplification unit through its gate;

a first NMOS transistor, connected to the first output terminal, for receiving the output of the I/O sense amplification unit through its gate;

a second NMOS transistor, connected between the first NMOS transistor and a ground voltage terminal, for receiving the output of the first inverter through its gate;

a first latch for latching a signal loaded at the first output terminal;

a third inverter for inverting the first bit of the pipe latch output control signal;

a fourth inverter for inverting an output of the third inverter;

a third PMOS transistor, connected to the power supply voltage terminal, for receiving an output of the fourth inverter;

a fourth PMOS transistor, connected between the third PMOS transistor and a second output terminal, for receiving an output of the first latch through its gate;

a third NMOS transistor, connected to the second output terminal, for receiving the output of the first latch through its gate; and a fourth NMOS transistor, connected between the third NMOS transistor and the ground voltage terminal, for receiving the output of the third inverter through its gate, wherein a signal loaded at the second output terminal is inputted to the temporal store unit.

* * * * *